United States Patent

Miyazaki

[11] Patent Number: 6,031,607
[45] Date of Patent: Feb. 29, 2000

[54] SYSTEM AND METHOD FOR INSPECTING PATTERN DEFECT

[75] Inventor: Yoko Miyazaki, Tokyo, Japan

[73] Assignee: Mitsubishi Denki Kabushiki Kaisha, Tokyo, Japan

[21] Appl. No.: 09/064,224

[22] Filed: Apr. 22, 1998

[30] Foreign Application Priority Data

Oct. 13, 1997 [JP] Japan .................................. 9-278717
Mar. 13, 1998 [JP] Japan .................................. 10-63047

[51] Int. Cl.[7] .................................................. G01N 21/00
[52] U.S. Cl. ...................... 356/237.1; 356/354; 250/550; 359/561; 359/559
[58] Field of Search ........................... 356/237.1, 237.2, 356/354; 359/561, 559; 250/550

[56] References Cited

U.S. PATENT DOCUMENTS

| | | | |
|---|---|---|---|
| 4,929,081 | 5/1990 | Yamamoto et al. | 356/354 |
| 5,289,260 | 2/1994 | Miyazaki et al. | |
| 5,379,150 | 1/1995 | Miyazaki et al. | |
| 5,617,203 | 4/1997 | Kobayashi et al. | 356/237 |
| 5,774,222 | 6/1998 | Maeda et al. | 356/394 |

FOREIGN PATENT DOCUMENTS

| | | |
|---|---|---|
| 2-114386 | 4/1990 | Japan . |
| 5-113407 | 5/1993 | Japan . |
| 9-43160 | 2/1997 | Japan . |

Primary Examiner—Robert H. Kim
Assistant Examiner—Roy M. Punnoose
Attorney, Agent, or Firm—Oblon, Spivak, McClelland, Maier & Neustadt, P.C.

[57] ABSTRACT

The invention is a pattern defect inspection system and method for improving the inspection speed, simplifying the system, and enlarging the inspection object, in which a correlation circuit (24) selects from a plurality of reference images in reference image storing means (22) one having the highest correlation with a detection image in detection image storing means (23) and inputs it to a difference circuit (25); the difference circuit (25) forms a difference image based on a reference image from the correlation circuit (24) and a detection image from the detection image storing means (23); a defect decision circuit (26) decides the position and size of a defect in a wafer under test 41, based on the difference image from the difference circuit (25); and the result is inputted to defect information processing means (27) to output as a defect information.

20 Claims, 17 Drawing Sheets

DETECTION SCOPE $S_1$    DETECTION SCOPE $S_2$

SYSTEM AND METHOD FOR INSPECTING PATTERN DEFECT

BACKGROUND OF THE INVENTION

1. Field of the Invention

The present invention relates to a pattern defect inspection system and a pattern defect inspection method for inspecting defects in regular structures formed on surfaces of articles, such as semiconductor integrated circuits, plasma displays, and liquid crystal panels, i.e., pattern defects of articles due to foreign matters or dust from process devices themselves in manufacturing process.

2. Description of the Background Art

FIG. 24 shows a construction of a pattern defect inspection system as described in Japanese Patent Application Laid-Open No. 8-2506725 (1996), as an example of conventional pattern defect inspection systems.

In FIG. 24, a reference number 101 indicates a laser light source, number 102 indicates a collimator for enlarging laser light, number 103 indicates enlarged parallel light, numbers 111, 112 indicate a half mirror, number 104 indicates a wafer under test, and number 120 indicates a mount for mounting the wafer 104. The mount 120 comprises inclination adjusting units 116, 117, which adjust the inclination on a mount surface in the longitudinal and the transverse directions, and a rotational angle adjusting unit 118 for adjusting the inclination on a mount surface. A Fourier transform lens 105 collects reflected diffraction light from a surface pattern of the wafer 104 and forms a pattern of the reflected diffraction light. An ITV camera for defect inspection 106 is disposed at a position at which the reflected diffraction light collected by the Fourier transform lens 105 is formed. A spatial filter 107 interrupts the reflected diffraction light from a normal pattern among the surface patterns of the wafer 104, and is disposed at the rear focal position of the Fourier transform lens 105. A signal processor 108 processes output signals from the ITV camera 106 to detect a defect position of the wafer 104. An ITV camera 113 detects the pattern of the reflected diffraction light at the rear focal position of the Fourier transform lens 105 through the half mirror 112. A controller 114 receives detection outputs from the ITV camera 113 to calculate the amount of position deviation between the pattern of the reflected diffraction light from the normal pattern of the wafer 104 and the interrupting pattern of the spatial filter 107, and sends correction instructions to the inclination adjusting units 116, 117, and the rotational angle adjusting unit 118. A display 115 displays the pattern defect of the wafer 104.

Operation of the above system is described herebelow. The laser light irradiated from a laser light source 101 is enlarged by a collimator 102 and reflected from a half mirror 111 and then irradiated to a wafer under test 104. The reflected diffraction light from the wafer 104 passes through the half mirror 111 and is collected by a Fourier transform lens 105 and then divided by a half mirror 112 into two, one of which reaches a spatial filter 107 and the other enters an ITV camera 113. Since the spatial filter 107 and the ITV camera 113 are both disposed at the rear focal position of the Fourier transform lens 105, the pattern of the reflected diffraction light on the spatial filter 107 becomes the same as that detected by the ITV camera 113.

An interrupting pattern for reflected diffraction light that interrupts the reflected diffraction light from the normal pattern of the wafer 104 is formed on the entire surface of the spatial filter 107. In a state where the pattern of the reflected diffraction light from the normal pattern of the wafer 104 and the interrupting pattern of the spatial filter 107 are aligned, in the reflected diffraction light from the wafer 104 which have reached the spatial filter 107, the reflected diffraction light from the normal pattern is interrupted by the space filter 107 while the reflected diffraction light from a defect passes through the spatial filter 107. The latter is received by the ITV camera 106 and the detected defect signal is inputted to a signal processor 108 to detect a defect position and the like.

Description will be given of matching of the pattern of the reflected diffraction light from the normal pattern of a wafer under test 104 and the interrupting pattern of a spatial filter 107. In the formation of a spatial filter 107, when exposing a photographic recording plate by using the reflected diffraction light from a sample wafer, the pattern of the reflected diffraction light from the sample wafer is taken in a controller 114 through a half mirror 112 and an ITV camera 113, and is then stored in storing means of the controller 114. At the time of inspection, the pattern of the reflected diffraction light of the normal pattern of the wafer 104 is taken in the controller 114 through the half mirror 112 and the ITV camera 113. The controller 114 compares the pattern thus taken and the above stored pattern to calculate the distance of position deviation in the longitudinal and transverse directions and the angle of position deviation. Based on these values, the controller 114 drives longitudinal and transverse inclination adjusting units 116, 117 and a rotation angle adjusting unit 118 to correct the position.

In the above pattern defect inspection system, the inclination is corrected by driving the inclination adjusting units 116, 117, when a deviation occurs between the pattern of the reflected diffraction light from the normal pattern of the wafer 104 and the interrupting pattern of the spatial filter 107. Thus, if inspected a large area wafer having a wide fluctuation of inclination, the amount of correction will be increased to lower the inspection speed. Moreover, since the correction of inclination is performed whenever such a deviation occurs, the number of corrections and the amount of correction are increased, making it difficult to improve the inspection speed.

In addition, since the inclination adjusting units 116, 117 are required to be mounted on the mount 120, the structure of the mount 120 becomes complicated and, if its height is increased, the positioning accuracy of defect detection lowers.

Further, in order to determine the amount of correction for matching the pattern of the reflected diffraction light from the normal pattern and the interrupting pattern of the spatial filter 107, it is necessary to provide the half mirror 112, the ITV cameral 113 and the controller 114, resulting in a complicated system.

Further, although the central portion of the wafer 104, i.e., portion where a pattern is satisfactorily repeated in the both right and left directions, can be inspected because most reflected diffraction light from the normal pattern are interrupted by the spatial filter 107, portion including a region not regarded as a repetitive region due to insufficient pattern repetition, e.g., the edges and corners of the wafer 104, isolated patterns, logic patterns, cannot be inspected because even reflected diffraction light from the normal pattern passes through the spatial filter 107. This causes the problem that the object of inspection is limited.

Further, since it is judged that all the luminescent spots in the images detected by the ITV camera 107 and the signal processor 108 are caused by the reflected diffraction light from the defects on the assumption that the reflected diffraction light from the normal pattern is completely interrupted by the spatial filter 107 and an algorithm to make detection of defect based on the luminescent spot is adopted, there is another problem that if the spatial filter 107 is deviated from an origin even a little or the angle of reflection of the reflected diffraction light from the normal pattern is deviated due to the warp of the wafer under test 104, the reflected diffraction light from the normal pattern passes through the spatial filter 107, not being completely interrupted, and the ITV camera 106 receives the light as a stray light, leading to mistaken detection of defect.

SUMMARY OF THE INVENTION

According to a first aspect of the present invention, a pattern defect inspection system for detecting a defect of a pattern disposed regularly on a surface of an object under test, comprises: light irradiation means for irradiating first parallel light to the object; a lens for collecting a reflected diffraction light from the object; a filter for interrupting a reflected diffraction light from a normal pattern of the object, disposed at a rear focal position of the lens; first detecting means for receiving the reflected diffraction light passed through the filter to obtain a detection image; storing means for storing a plurality of reference images; image processing means for obtaining a difference image from a difference between the detection image and the reference images; and defect recognizing unit for recognizing the defect based on an optimum difference image obtained from the detection image and one selected from the reference images as being most similar to the detection image; and which is characterized in that the reference images are obtained by shifting the filter step-wisely from an original position in a plane vertical to an optical axis, receiving a reflected diffraction light from a sample free from the defect by the first detecting means and detecting as an image.

According to a second aspect of the present invention, the pattern defect inspection system of the first aspect is characterized in that the first parallel light is irradiated from an oblique direction to the object.

According to a third aspect of the present invention, the pattern defect inspection system of the first aspect is characterized in that the image processing means has a plurality of correlation circuits for examining a correlation between the reference images and the detection image.

According to a fourth aspect of the present invention, the pattern defect inspection system of the first aspect further includes an inclination adjusting unit for correcting an inclination of the object, and is characterized in that an amount corrected by the inclination adjusting unit is obtained by converting a shift amount of the filter in obtaining the reference images providing the optimum difference image, into an inclination.

According to a fifth aspect of the present invention, the pattern defect inspection system of the fourth aspect is characterized in that the filter is obtained by irradiating second parallel light to the sample and exposing a photographic recording plate disposed at the rear focal position with a reflected diffraction light from the sample, and that an aperture of the first parallel light is larger than an aperture of the second parallel light.

According to a sixth aspect of the present invention, the pattern defect inspection system of the fourth aspect further includes second detecting means for detecting an amount of light of the reflected diffraction light at the first detecting means, and is characterized in that a correction with the inclination adjusting unit is executed when the amount of light exceeds a preset threshold value.

According to a seventh aspect of the present invention, the pattern defect inspection system of the first aspect further includes a filter driving unit for correcting a position of the filter in the plane, and is characterized in that an amount corrected by the filter driving unit is obtained as a shift amount of the filter in obtaining the reference images used for providing the optimum difference image.

According to an eighth aspect of the present invention, the pattern defect inspection system of the seventh aspect is characterized in that the filter is obtained by irradiating second parallel light to the sample and exposing a photographic recording plate disposed at the rear focal position with a reflected diffraction light from the sample, and that an aperture of the first parallel light is larger than an aperture of the second parallel light.

According to a ninth aspect of the present invention, the pattern defect inspection system of the seventh aspect further includes second detecting means for detecting an amount of light of the reflected diffraction light at the first detecting means, and is characterized in that a correction with the filter driving unit is executed when the amount of light exceeds a preset threshold value.

According to a tenth aspect of the present invention, a pattern defect inspection system for detecting a defect of a pattern disposed regularly on a surface of an object under test, comprises: light irradiation means for irradiating parallel light to the object; a lens for collecting a reflected diffraction light from the object; a filter for interrupting a reflected diffraction light from a normal pattern of the object, disposed at a rear focal position of the lens; detecting means for receiving the reflected diffraction light passed through the filter to obtain a detection image; and an optical system driving unit for shifting an optical system comprising the lens, the filter, and the detecting means.

According to an eleventh aspect of the present invention, a pattern defect inspection method for detecting a defect of a pattern disposed regularly on a surface of an object under test, comprises the steps of: irradiating first parallel light to the object; collecting a reflected diffraction light from the object by a lens; interrupting a reflected diffraction light from a normal pattern of the object by a filter disposed at a rear focal position of the lens; receiving the reflected diffraction light passed through the filter to obtain a detection image; previously preparing a plurality of reference images; obtaining difference images from a difference between the detection image and the reference images; recognizing the defect based on an optimum difference image obtained from the detection image and one selected from the reference images as being most similar to the detection image; and which is characterized in that the reference images are obtained by shifting the filter step-wisely from an original position in a plane vertical to an optical axis, receiving a reflected diffraction light from a sample free from the defect, and detecting it as an image.

According to a twelfth aspect of the present invention, the pattern defect inspection method of the eleventh aspect is characterized in that the reference images are obtained by obtaining a plurality of reference images for a first scope of a basic pattern of the sample, shifting the sample, and obtaining a plurality of reference images for a second scope.

According to a thirteenth aspect of the present invention, the pattern defect inspection method of the eleventh aspect is characterized in that the filter is formed by exposing a photographic recording plate disposed at the rear focal position with the reflected diffraction light from a first scope of a basic pattern of the sample, shifting the sample and the photographic recording plate, and exposing the photographic recording plate with the reflected diffraction light from a second scope.

According to a fourteenth aspect of the present invention, the pattern defect inspection method of the eleventh aspect is characterized in that the optimum difference image is obtained by converting the difference images into two-axis brightness histograms whose one axis is brightness and another axis is the number of picture elements, and representing a first slope downward toward the right in each of the brightness histograms by straight line, the optimum difference image being a difference image providing the brightness histogram in which an absolute value of an inclination amount of the straight line is a maximum value; and that a picture element brighter than a threshold value set in a scope brighter than an intersection of the straight line and the one axis is recognized as a defect.

According to a fifteenth aspect of the present invention, the pattern defect inspection method of the eleventh aspect further includes the step of correcting an inclination of the object, and is characterized in that an amount of correction of the inclination is obtained by converting a shift amount of the filter in obtaining the reference images providing the optimum difference image, into an inclination.

According to a sixteenth aspect of the present invention, the pattern defect inspection method of the fifteenth aspect is characterized in that the obtained by irradiating second parallel light to the sample and exposing a photographic recording plate disposed at the rear focal position with a reflected diffraction light from the sample, and that an aperture of the first parallel light is larger than an aperture of the second parallel light.

According to a seventeenth aspect of the present invention, the pattern defect inspection method of the fifteenth aspect further includes the step of detecting an amount of light of the reflected diffraction light passed through the filter, and is characterized in that a correction of the inclination is executed when the amount of light exceeds a preset threshold value.

According to an eighteenth aspect of the present invention, the pattern defect inspection method of the eleventh aspect further includes the step of correcting a position of the filter in the plane, and is characterized in that an amount of correction of the position is obtained as a shift amount of the filter in obtaining the reference images providing the optimum difference image.

According to a nineteenth aspect of the present invention, the pattern defect inspection method of the eighteenth aspect is characterized in that the filter is obtained by irradiating second parallel light to the sample and exposing a photographic recording plate disposed at the rear focal position with a reflected diffraction light from the sample, and that an aperture of the first parallel light is larger than an aperture of the second parallel light.

According to a twentieth aspect of the present invention, the pattern defect inspection method of the eighteenth aspect further includes the step of detecting an amount of light of the reflected diffraction light passed through the filter, and is characterized in that a correction of the position is executed when the amount of light exceeds a preset threshold value.

According to a twenty-first aspect of the present invention, the pattern defect inspection system of the first aspect is characterized in that the light irradiation means comprises a laser light source which irradiates a laser light having an angle of divergence of not more than a hundred milliradians, and that the minimum unit of repetition of the pattern is relatively the same as or smaller than the diameter of the laser light.

In the pattern defect inspection system according to the first aspect of the present invention, even if the reflected diffraction light from the normal pattern passes through the filter due to an inclination, a pattern defect can be recognized based on an optimum difference image that is obtained from a difference between a detection image and the reference image most similar to the detection image among a plurality of reference images previously stored in the storing means. Therefore, unlike conventional pattern defect inspection systems, it is unnecessary to correct the inclination for matching the interrupting pattern of the filter with the pattern of reflected inclination light, thereby improving the inspection speed.

In the pattern defect inspection system according to the second aspect, if the regular diffraction light is too bright and has effect on inspection, it is possible to prevent such a light from being collected by the Fourier transform lens, to produce the defect inspection under a suitable condition.

In the pattern defect inspection system according to the third aspect, since the correlation between each reference image and a detection image are obtained by parallel processing of plural correlation circuits, the inspection speed is improved.

In the pattern defect inspection system according to the fourth aspect, since the correction amount of inclination is determined based on the shift amount of the filter in obtaining reference images providing an optimum difference image, it is unnecessary to provide an optical system for detecting the pattern position of the reflected diffraction light from the normal pattern in the rear focal surface of the lens, i.e., pattern position detecting means needed in conventional pattern defect inspection systems. This simplifies the system compared to conventional pattern defect inspection systems.

In the pattern defect inspection system according to the fifth aspect, since there is no need to convert the shift amount of the filter into the correction amount of inclination, the inspection speed is further improved than the system of the fourth aspect. In addition, no inclination adjusting unit is required to simplify the system.

In the pattern defect inspection system according to the sixth aspect, the scope of filtering of the filter can be broaden by increasing the aperture of first parallel light irradiated to an object under test than the aperture of second parallel light irradiated to a sample. The correction is performed only when the reflected diffraction light from the normal pattern starts to pass through the filter, i.e., only when the variation of inclination is significant. Thus, compared to cases where the correction is performed all the time, the number of corrections is lessened to improve the inspection speed.

In the pattern defect inspection system according to the seventh aspect, the correction is performed only when the amount of light of the reflected diffraction light from a defect that passes through the filter exceeds a preset arbitrary threshold value. Thus, compared with cases where the correction is performed all the time, the number of corrections is lessened to improve the inspection speed.

In the pattern defect inspection system according to the eighth aspect, when inspecting the entire object under test, the optical system is shifted by the optical system driving unit, instead of shifting an object under test. By applying this system to an object under test in which the deviation caused by the shift of the optical system is smaller than the deviation caused by the shift of the object, it is possible to suppress a reduction of inspection accuracy.

In the pattern defect inspection method according to the ninth aspect, even if the reflected diffraction light from the normal pattern passes through the filter due to the inclination, it is possible to recognize a pattern defect based on an optimum difference image obtained from a difference between a detection image and the reference image most similar to the detection image among a plurality of reference images previously stored. Accordingly, unlike conventional pattern defect inspection methods, this method requires no correction of inclination for matching the interrupting pattern of the filter with the pattern of the reflected diffraction light, thereby improving the inspection speed.

In the pattern defect inspection method according to the tenth aspect, even if in receiving the reflected diffraction light from a sample and detecting as an image, a detection scope is smaller than a basic pattern and image related to the whole scope of the basic pattern cannot be detected at a time, it is possible to properly obtain reference images.

In the pattern defect inspection method according to the eleventh aspect, even when the exposure scope of a photographic recording plate is smaller than a basic pattern and the photographic recording plate covering the whole scope of the basic pattern cannot be exposed at a time, it is possible to properly expose the photographic recording plate to prepare a filter.

In the pattern defect inspection method according to the twelfth aspect, portion with much noise and portion with less noise in an object under test can be set to have a different threshold value, enabling to provide the pattern defect inspection with high accuracy and to broaden the inspection object.

In the pattern defect inspection method according to the thirteenth aspect, since the correction amount of inclination is determined based on the shift amount of the filter in obtaining reference images providing an optimum difference image, the correction of inclination can be performed without complicating the system.

In the pattern defect inspection method according to the fourteenth aspect, since it is unnecessary to convert the shift amount of the filter into the correction amount of inclination, the inspection speed is higher than that of the pattern defect inspection method of the thirteenth aspect.

In the pattern defect inspection method according to the fifteenth aspect, the scope of filtering of the filter is broaden by increasing the aperture of first parallel light irradiated to an object under test than the aperture of second parallel light irradiated to a sample. In addition, since the correction is performed only when the reflected diffraction light from the normal pattern starts to pass through the filter, i.e., only when the variation of inclination is significant, the number of corrections is lessened compared to cases where the correction is made all the time, to improve the inspection speed.

In the pattern defect inspection method according to the sixteenth aspect, since the correction is performed only when the amount of light of the reflected diffraction light from a defect that passes through the filter exceeds a preset arbitrary threshold value, the number of corrections is lessened compared to cases where the correction is made all the time, to improve the inspection speed.

In the pattern defect inspection method according to the seventeenth aspect, since a laser light irradiated from a laser light source is regarded as a parallel light, it is not required to provide a collimator for making a light irradiated from light irradiation means parallel light.

An object of the present invention is to provide systems and methods for inspecting pattern defects that realize improved inspection speed, simple systems and a wide inspection range.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
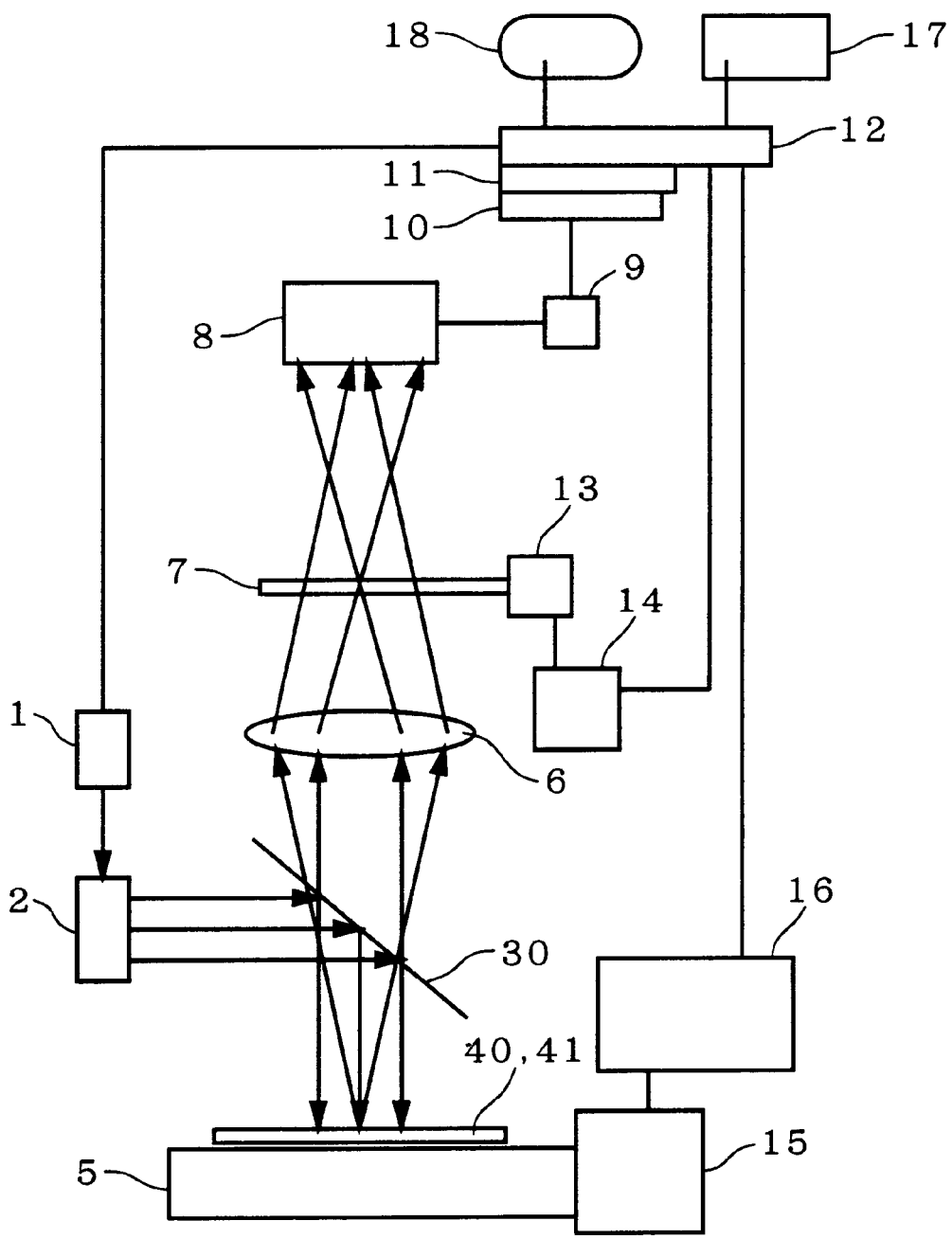
FIG. 1 is a diagram illustrating a construction of a pattern defect inspection system according to a first preferred embodiment of the present invention.

FIG. 1 shows a construction of a pattern defect inspection system according to a first preferred embodiment of the present invention. In FIG. 1, reference number 1 indicates a laser light source. A collimator 2 enlarges the laser light irradiated from the laser light source 1 to make it parallel light. A half mirror 30 irradiates the laser light enlarged by the collimator 2 to a sample wafer 40 free from pattern defect or a wafer under test 41 as an object of a pattern defect inspection. A mount 5 mounts the sample wafer 40 or the wafer under test 41, and has a rotation angle adjusting unit (not shown) for correcting the angular deviation of the wafer 41. A Fourier transform lens 6 collects the reflected diffraction light from the sample wafer 40 or the wafer under test 41. A spatial filter 7 is disposed at the rear focal position of the Fourier transform lens 6. Detecting means 8 receives the reflected diffraction light passing through the spatial filter 7 to detect is as an image, and comprises a semiconductor device or a phototube. Image storing means 9 stores images. Reference number 10 indicates image processing means. Defect recognizing means 11 recognizes defect positions and sizes as defect information. Main control means 12 sends defect information as a control data to the exterior of the system, e.g., a host server for mass production line. A spatial filter driving unit 13 drives the spatial filter 7. A spatial filter control unit 14 calculates the amount of drive of the spatial filter 7 based on the control data from the main control means 12 and transfers it to the spatial filter driving unit 13. A mount driving unit 15 drives the mount 5 such that the position inspected of the wafer 41 moves relatively with the image detection effective region of the detecting means 8. Mount control means 16 calculates the amount of control of the mount 5 based on the control data from the main control means 12 and transfers it to the mount driving unit 15. An input terminal 17, for inputting instructions of operation contents and inspection conditions. A display unit 18 is used in observing the defect of the wafer 41 and in displaying the inspection results.

Figure 2:
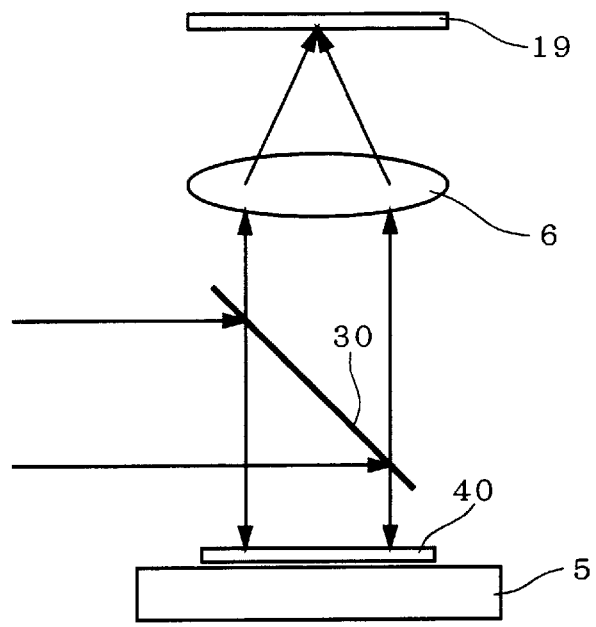
FIG. 2 is a diagram for explaining a process of forming a spatial filter.
Figure 3:
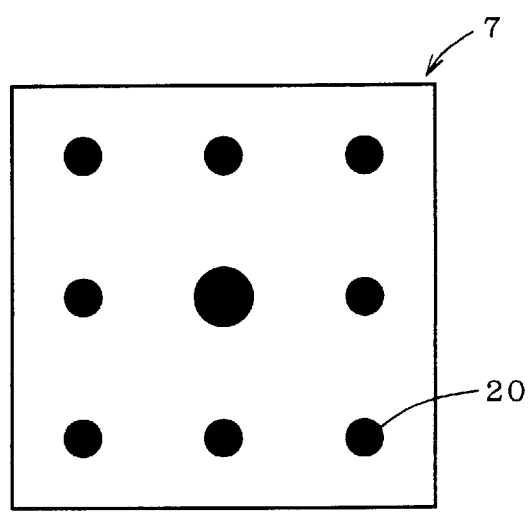
FIG. 3 is a diagram showing a spatial filter.

Detailed description of a spatial filter 7 is given herebelow. FIG. 2 is a diagram for explaining a process of forming a spatial filter 7. Firstly, a sample wafer 40 is positioned and mounted on a mount 5. A photographic recording plate 19 is disposed at the rear focal position of a Fourier transform lens 6. With this state, by irradiating the laser light from a laser light source 1, the photographic recording plate 19 is exposed by the reflected diffraction light from the normal pattern of the sample wafer 40. Thereafter, the exposed photographic recording plate 19 is developed on the negative to form a spatial filter 7 as shown in FIG. 3. As can be seen from the figure, an interrupting pattern 20 interrupting the reflected diffraction light from the normal pattern is formed over the entire surface.

Figure 4:
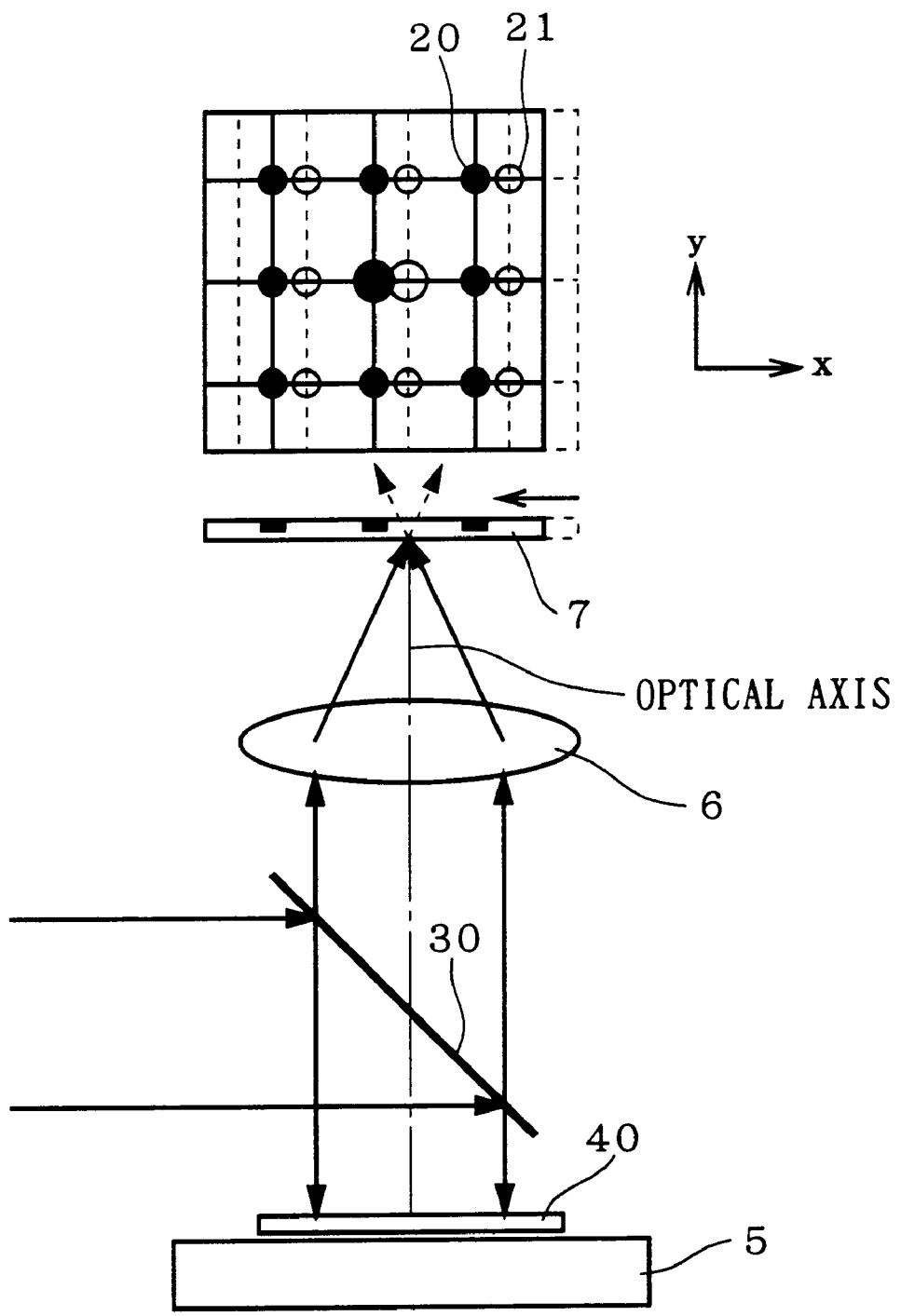
FIG. 4 is a diagram for explaining a pattern defect inspection method according to the first preferred embodiment.

A pattern defect inspection method using a pattern defect inspection system as shown in FIG. 1 is described herebelow. FIG. 4 is a diagram for explaining such a pattern defect inspection method. Firstly, with a sample wafer 40 mounted on a mount 5, laser light is irradiated from a laser light source 1. This laser light is enlarged by a collimator 2 and reflected from a half mirror 30 to irradiate the sample wafer 40. The reflected diffraction light from the sample wafer 40 passes through the half mirror 30 and is collected by a Fourier transform lens 6 and then reaches a spatial filter 7. In this case, the spatial filter 7 is shifted, by a small amount in the perpendicular plane to an optical axis, from the position where a photographic recording plate 19 is arranged at the time of forming the spatial filter 7, i.e., the position at which the reflected diffraction light from the normal pattern of the sample wafer 40 is most effectively interrupted (hereinafter referred to as "the origin of the spatial filter 7"). This produces a deviation between an interrupting pattern 20 of the spatial filter 7 and a pattern 21 of the reflected diffraction light from the normal pattern, and therefore, a part of the latter passes through the spatial filter 7. Such reflected diffraction light is received by detecting means 8 and detected as an image, which is hereinafter referred to as "reference image."

Figure 5:
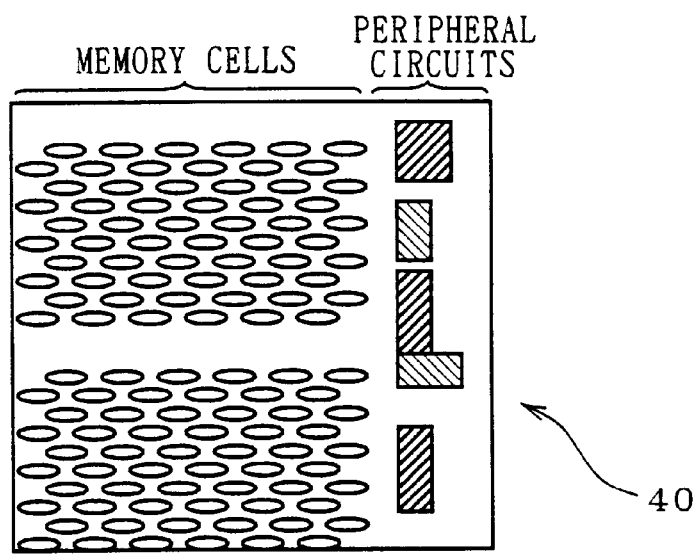
FIG. 5 is a plan view showing an example of a sample wafer.
Figure 6:
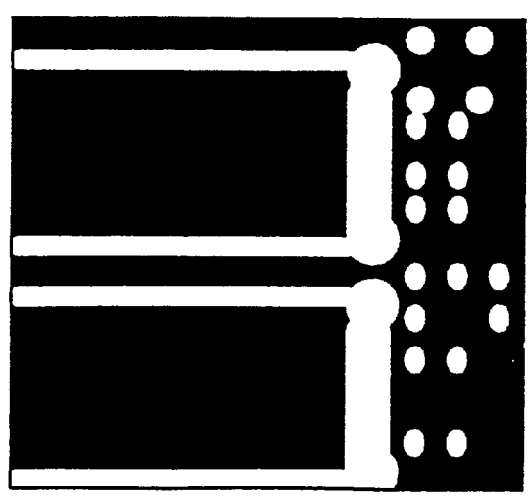
FIG. 6 is a diagram showing a reference image obtained when a spatial filter is disposed at the origin.
Figure 7:
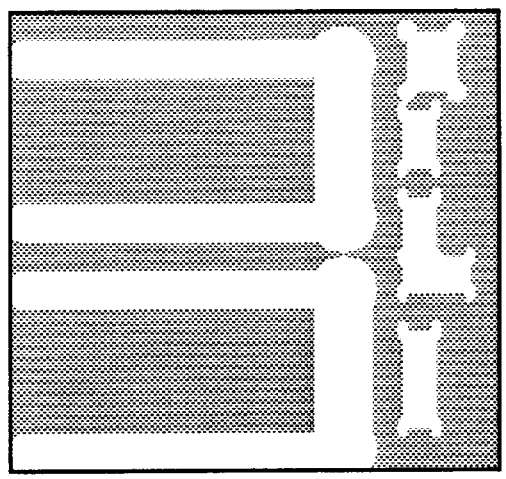
FIG. 7 is a diagram showing a reference image obtained when a spatial filter is shifted from the origin.

FIG. 5 is a plan view of an example of a sample wafer 40. There is shown a pattern of a sample wafer on which memory cells and peripheral circuits are formed. FIG. 6 shows a reference image obtained when a spatial filter 7 is disposed at the origin. FIG. 7 shows a reference image obtained when the spatial filter 7 is shifted from the origin. It should be noted that the reference image in FIG. 7 has light portions (white portions) larger than those of the reference image in FIG. 6. This results from that the reflected diffraction light received by the detecting means 8 is increased as the reflected diffraction light passing through the spatial filter 7 is increased due to the deviation between the interrupting pattern 20 of the spatial filter 7 and the pattern 21 of the reflected diffraction light from the normal pattern.

Then, the spatial filter 7 is shifted step-wisely from the origin to obtain a reference image at each step in the same manner as described above. The spatial filter 7 is preferably shifted by from tens of microns to hundreds of microns per step in the range of ±1 to 2 mm in both X and Y directions in the above perpendicular plane. A plurality of reference images thus obtained are stored in image storing means 9. The reason why the detecting means 8 receives the reflected diffraction light even if the sample wafer 40 is mounted on the mount 5 as shown in FIG. 6, and the spatial filter 7 is disposed at the origin, is that the reflected diffraction light from a region not regarded as the aforesaid repetitive region passes through the spatial filter 7.

Next, in a state where a wafer under test 41 is mounted on the mount 5 and the spatial filter 7 is disposed at the origin, the laser light from the laser light source 1 is irradiated. This laser light is enlarged by a collimator 2 and reflected from a half mirror 30 to irradiate the wafer 41. The reflected diffraction light from the wafer 41 passes through the half mirror 30 and is collected by a Fourier transform lens 6 and reaches the spatial filter 7.

Figure 8:
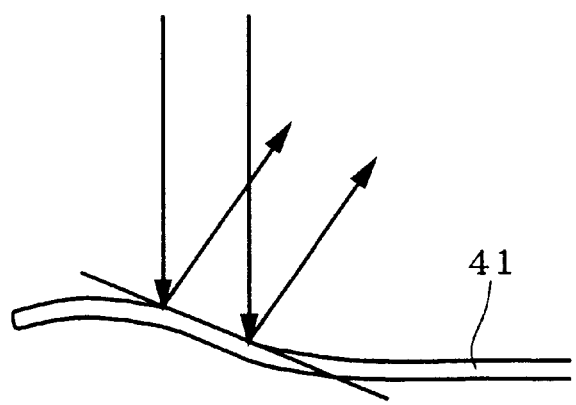
FIG. 8 is a diagrammatic representation of a deviation of a reflected diffraction light caused by a warp of the surface of a wafer under test.

FIG. 8 is a diagrammatic representation of a deviation of the reflected diffraction light caused by the warp of the surface of the wafer 41. When a warp is present on the surface of a wafer 41 due to heat treatment and the like during its manufacturing process, the reflected diffraction light from the wafer 41 reflects in the direction different from the irradiation direction of laser light, depending on the angle of the warp.

Figure 9:
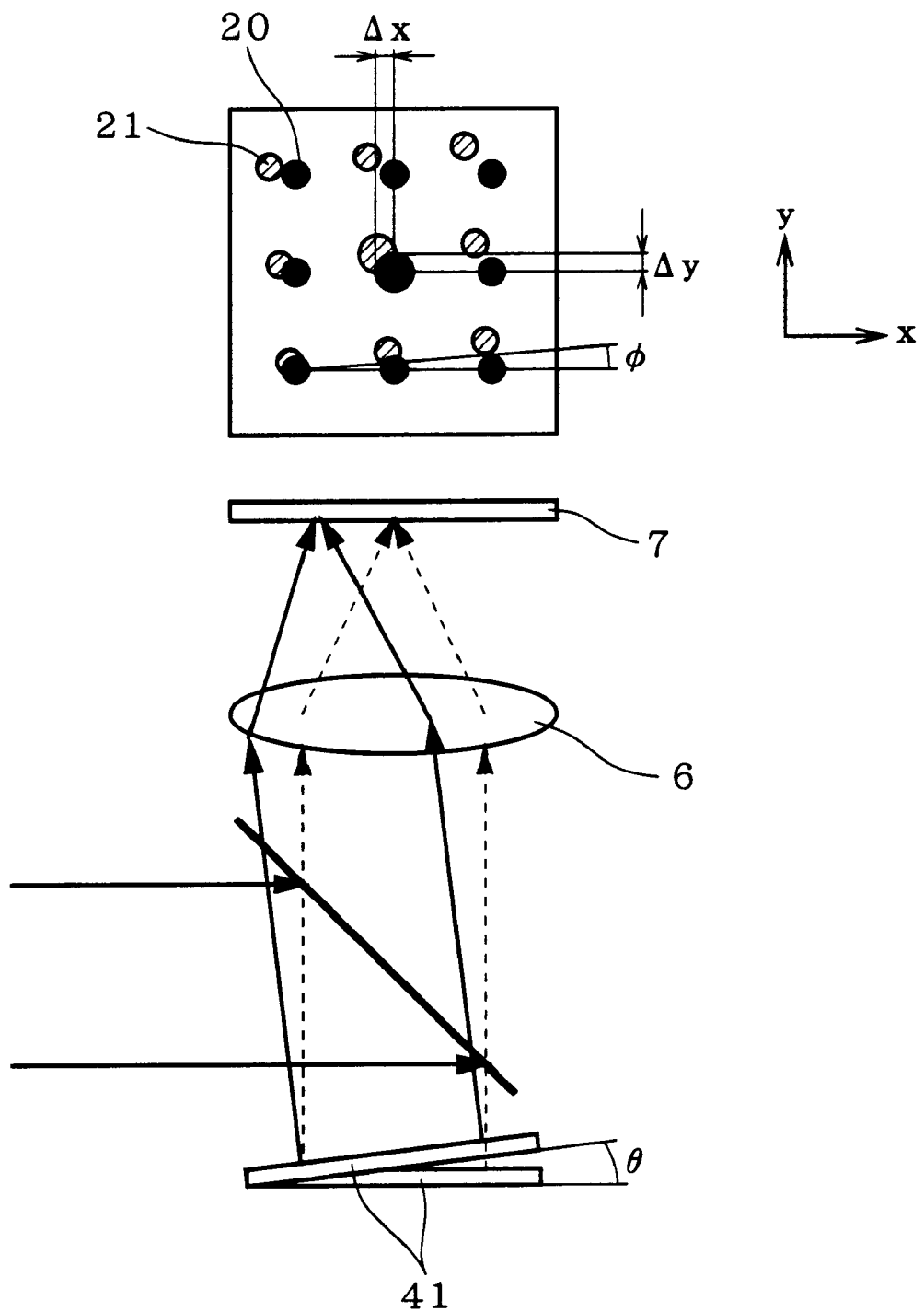
FIG. 9 is a diagram showing a reflected diffraction light from a wafer under test having an inclination $\theta$.

FIG. 9 shows a reflected diffraction light when the warp of the surface is taken as a slope (inclination) of a wafer under test 41, that is, the reflected diffraction light from the wafer 41 having an inclination θ. In FIG. 9, the reflected diffraction light from a normal wafer under test 41 free from inclination is indicated by broken line, the reflected diffraction light from a wafer under test 41 having an inclination θ is indicated by solid line. As shown in FIG. 9, the pattern 21 of the reflected diffraction light from the wafer 41 having the inclination θ causes a deviation Δx in X axis direction, a deviation Δy in Y axis direction, and a deviation of angle ø to X axis, above the surface of the spatial filter 7. Due to the presence of the inclination θ, even the reflected diffraction light from the normal pattern cannot be completely interrupted by the interrupting pattern 20 of the spatial filter 7. Therefore, not only the reflected diffraction light from an isolated defect but the reflected diffraction light from a repetitive normal pattern passes through the spatial filter 7 and is received by detecting means 8 and then detected as an image. It is noted that the above deviation of angle ø can be adjusted suitably by a rotational angle adjusting unit on the mount 5. The adjusting unit can be any means known in the art.

Figure 10:
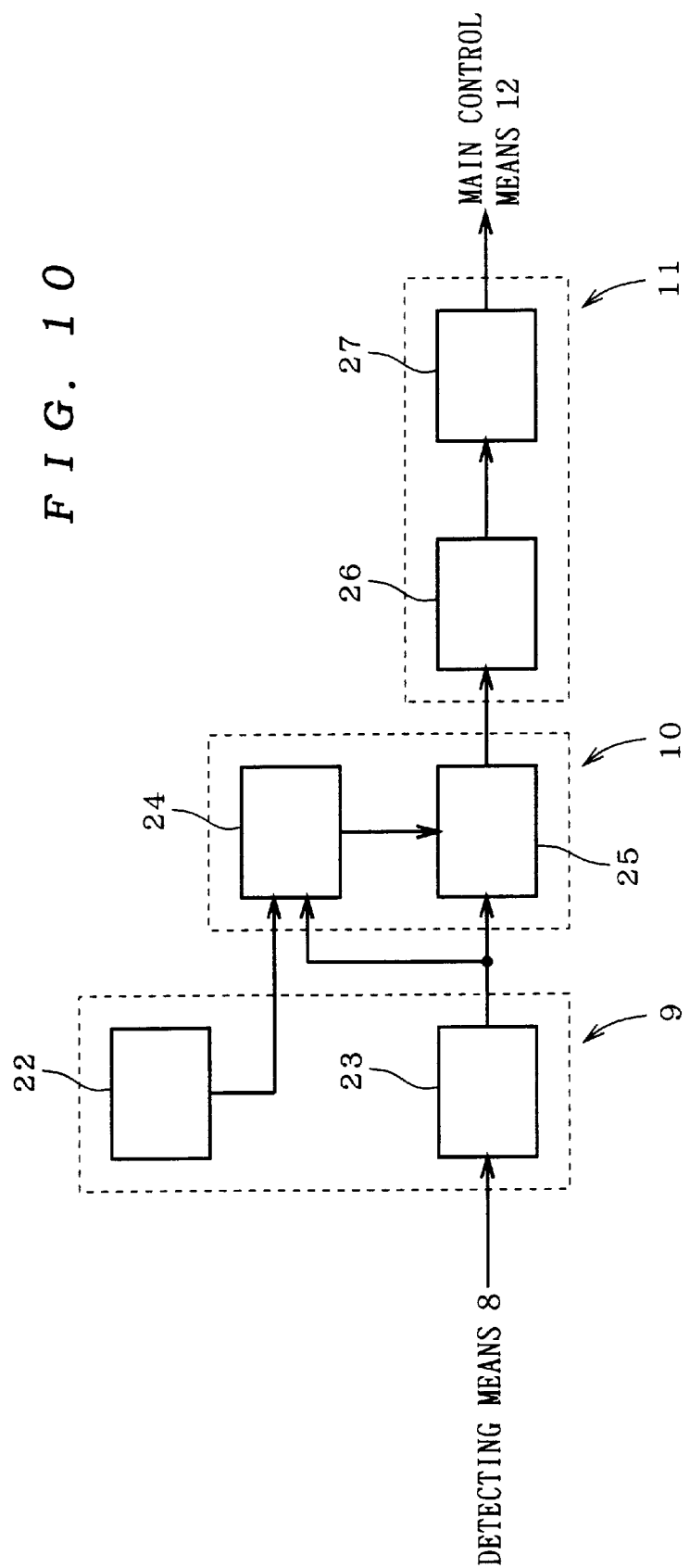
FIG. 10 is a block diagram showing a construction of image storing means, image processing means and defect recognizing means.

FIG. 10 is a block diagram showing an example of a construction of image storing means 9, image processing means 10, and defect recognizing means 11. The image storing means 9 comprises reference image storing means 22 and detection image storing means 23. The reference image storing means 22 stores a plurality of reference images which are obtained by step-wise shift of a spatial filter 7 with a sample wafer 40 mounted on a mount 5. The detection image storing means 23 stores image obtained when the spatial filter 7 is disposed at the origin with a wafer under test 41 on the mount 5, i.e., the image detected by the detecting means 8, which is hereinafter referred to as a detection image. The image processing means 10 comprises a correlation circuit 24 and a difference circuit 25. The reference image storing means 22 and the detection image storing means 23 are both connected to the correlation circuit 24, which selects the image most similar to the detection image, i.e., the image with the highest correlation, from a plurality of reference images stored in the reference image storing means 22, and inputs it to the difference circuit 25. Specifically, the brightness of a reference image and that of a detection image are compared by picture element to obtain a correlation function, from which a correlation coefficient is obtained. It is decided that correlation becomes higher as the correlation coefficient approaches one (1). The correlation circuit 24 and the detection image storing means 23 are both connected to the difference circuit 25, which forms a difference image based on a difference between a reference image from the correlation circuit 24 and a detection image from the detection image storing means 23. The defect recognizing means 11 comprises a defect decision circuit 26 and defect information processing means 27. A difference image from the difference circuit 25 is inputted to the defect decision circuit 26, which then decides the position and size of a defect present in a wafer under test 41, based on the difference image. The result is inputted to the defect information processing means 27 and processed as defect information and then transferred to main control means 12.

Thus, in accordance with the pattern defect inspection system of the first preferred embodiment, even if the reflected diffraction light from the normal pattern passes through the spatial filter 7 due to an inclination θ, the reference image having the highest correlation with a detection image can be selected from a plurality of reference images previously stored in the image storing means 9, and a difference image is formed based on a difference between the selected reference image and the detection image. Based on the difference image, the defect of a wafer under test 41 is recognized. That is, the deviation of reflected diffraction light due to the variation of inclination θ can be compensated by the deviation of the spatial filter 7. Thus, this system requires no correction of inclination for matching the interrupting pattern 20 of the spatial filter 7 and the pattern 21 of the reflected diffraction light from the normal pattern, as in the conventional pattern defect inspection systems. This enables to improve the inspection speed. Particularly, a noticeable effect is produced for a wafer under test 41 having a large area because its inclination θ requires a great amount of correction.

In addition, no inclination adjusting unit is required to be mounted on the mount 5, which simplifies the construction of the mount 5, leading to improved positioning accuracy of defect inspection.

Further, the reference image storing means 22 stores a plurality of images obtained by step-wise shift of the spatial filter 7 as reference images. Specifically, the shift of the spatial filter 7 forcefully produces a deviation between the interrupting pattern 20 of the spatial filter 7 and the pattern 21 of the reflected diffraction light from the normal pattern, which is supposed to be due to the warp of the wafer under test 41 and the like. The actual defect inspection uses an algorithm to select one image having the highest correlation with the detection image out of the plurality of reference images obtained as above and recognize a defect based on the difference image formed based on a difference between the selected reference image and the detection image. In other words, comparison between the selected reference image and the detection image is made on the assumption that the selected reference image and the detection image almost coincide if the wafer under test 41 has no defect, to detect any portion which is shown dark in the reference image and bright in the detection image or shown bright in the reference image and dark in the detection image as a defect. Therefore, a proper defect inspection can be achieved even in a case where the pattern of the reflected diffraction light from the wafer under test 41 becomes entirely brighter due to invasion of the regular reflection light or low-order diffraction light or a case where a background noise becomes high, besides the case where the angle of reflection of the reflected diffraction light from the normal pattern is deviated due to the warp of the wafer under test 41, and further, it becomes possible to properly inspect a portion including a region not regarded as a repetitive region due to insufficient pattern repetition, which could not be inspected by the background-art pattern defect inspection system.

Although the above preferred embodiment utilizes a spatial filter 7 formed by using a photographic recording plate 19, without limiting to this spatial filter 7, it is possible to use a metallic plate comprising a wire-shaped interrupting portion, or a filter whose interrupting portion is formed by printing, a liquid crystal plate and the like, because the resulting effect is completely the same although they have a difference in light interrupting performance.

Second Preferred Embodiment

Figure 11:
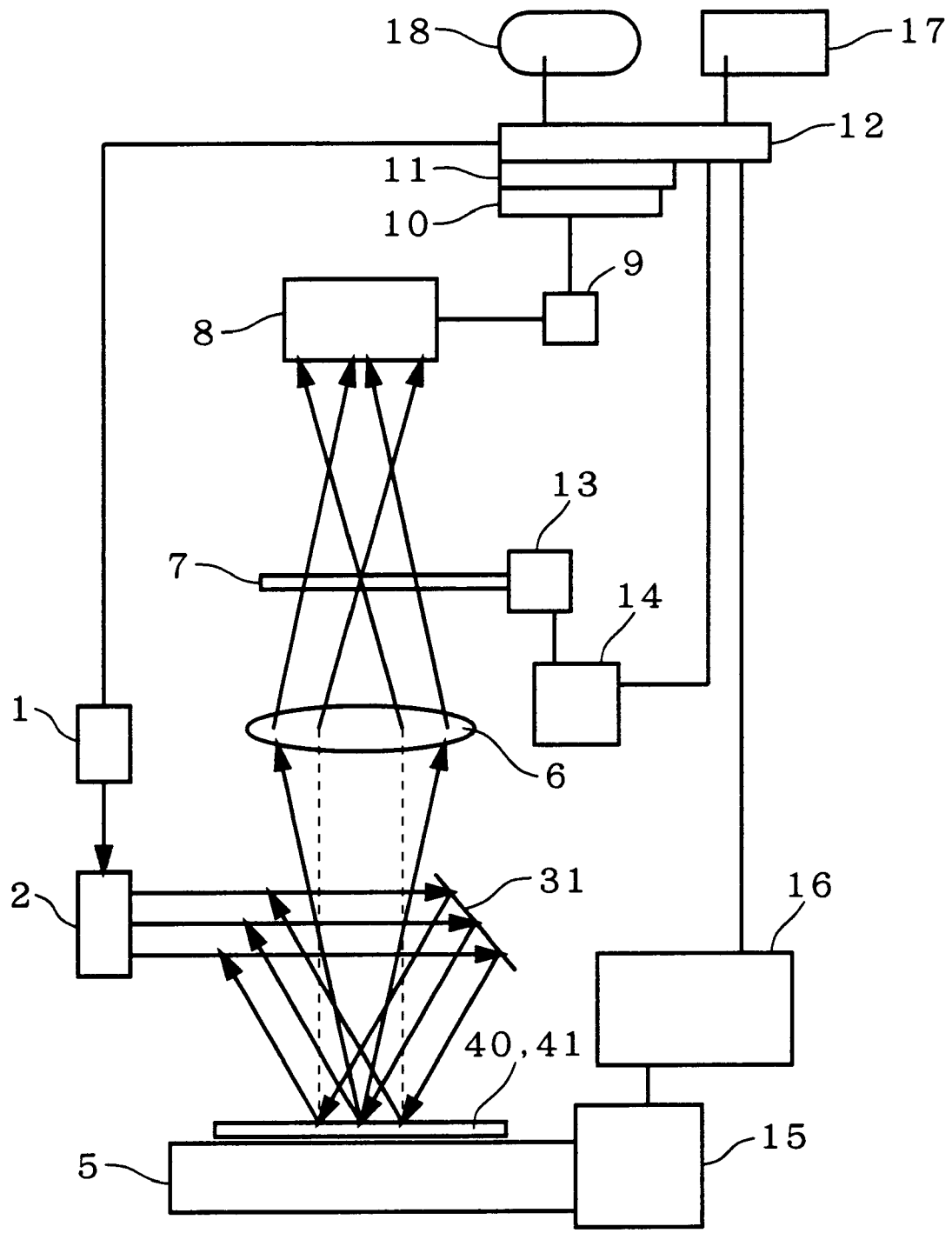
FIG. 11 is a diagram showing a construction of a pattern defect inspection system according to a second preferred embodiment of the present invention.

Although in the first preferred embodiment laser light is irradiated by a half mirror 30 from the front of a wafer under test 41, laser light can be irradiated from an oblique direction. FIG. 11 shows a construction of a pattern defect inspection system according to a second preferred embodiment of the present invention. The laser light enlarged by a collimator 2 is reflected from a half mirror 31 to irradiate a wafer under test 41 from an oblique direction. When laser light is irradiated from an oblique direction, the regular reflection light of the laser light does not reach a Fourier transform lens 6 whereas the diffraction light from the normal pattern or a defect reaches the lens 6. In FIG. 11, the diffraction light from the normal pattern is shown by broken line. By collecting this diffraction light by the Fourier transform lens 6 and interrupting by the spatial filter 7, the same pattern defect inspection as in the first preferred embodiment can be performed.

Thus, in the pattern defect inspection system of the second preferred embodiment comprising laser light irradiation from an oblique direction of the wafer 41, if the regular diffraction light is too bright and has effect on inspection, it is possible to prevent such a light from being collected by the Fourier transform lens 6, to produce the defect inspection under a suitable condition.

Third Preferred Embodiment

Figure 12:
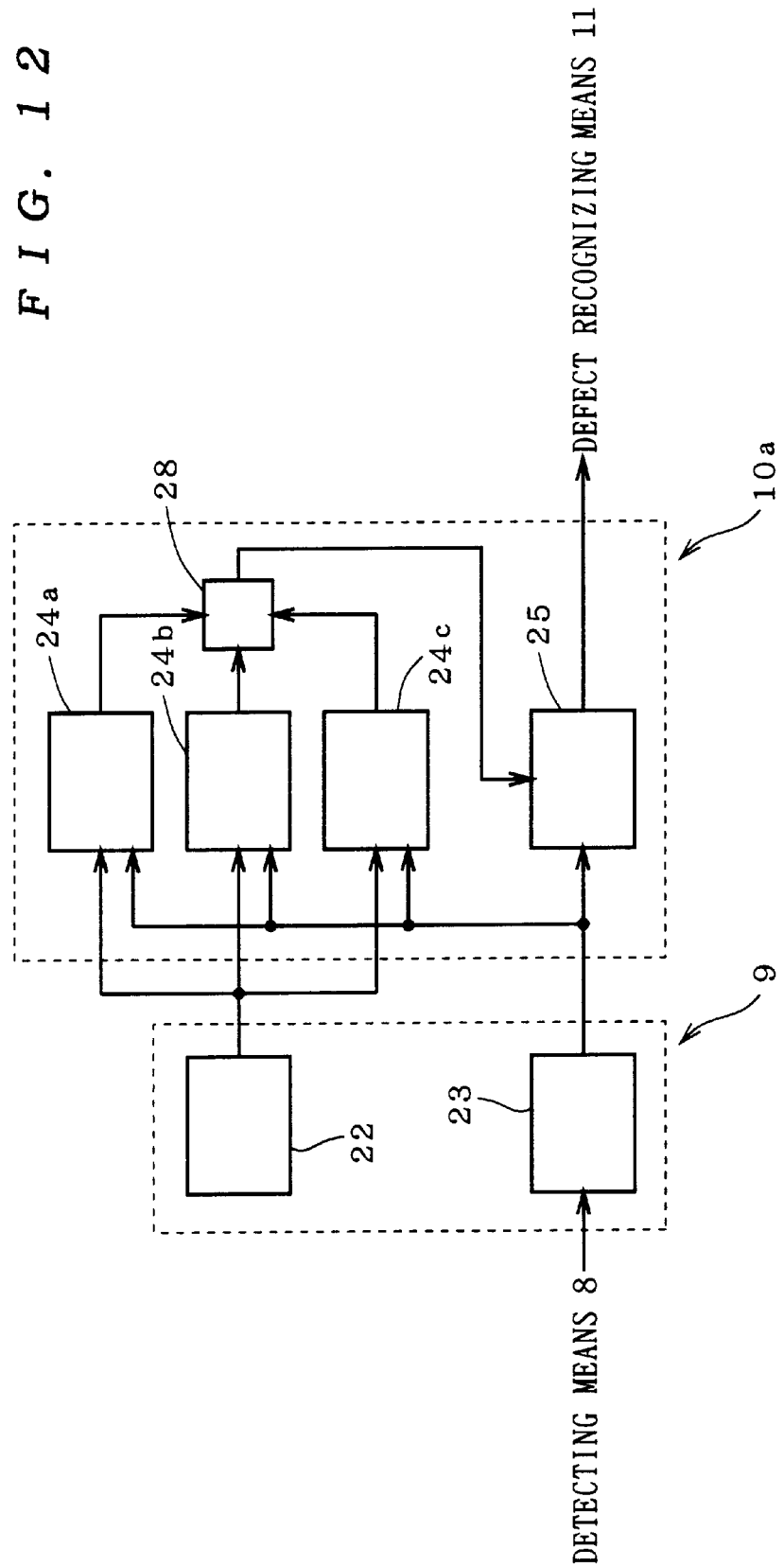
FIG. 12 is a block diagram showing a construction of image processing means along with image storing means.

Although in the first preferred embodiment the image processing means 10 has only one correlation circuit 24, it is more preferable to provide a plurality of correlation circuits. FIG. 12 is a block diagram showing a construction of image processing means 10a comprising a plurality of correlation circuits, along with a construction of image storing means 9. In FIG. 12, there are provided three correlation circuits i.e., 24a to 24c. Image processing means 10a comprises the correlation circuits 24a to 24c, a difference circuit 25, and a decision circuit 28. Image storing means 9 comprises reference image storing means 22 and detection image storing means 23, which are connected to the correlation circuits 24a to 24c, respectively. Detection image is inputted to each of the correlation circuits 24a to 24c, and a plurality of reference images are properly sorted and inputted to the circuits 24a to 24c, to decide the correlation between the reference images and the detection image. The results are inputted as correlation values to the decision circuit 28, which selects the reference image having the highest correlation with the detection image, based on the inputted plural correlation values, and then inputs the above reference image to the difference circuit 25. The difference circuit 25 forms a difference image from a difference between the inputted reference image and detection image.

Thus, the pattern defect inspection system of the third preferred embodiment in which the correlation values between reference images and a detection image are obtained by parallel processing of plural correlation circuits, enables to improve the inspection speed when reference image or detection image has a large number of picture elements, or when the pattern of a wafer under test is complicated and much time is required per correlation calculation.

Fourth Preferred Embodiment

Figure 13:
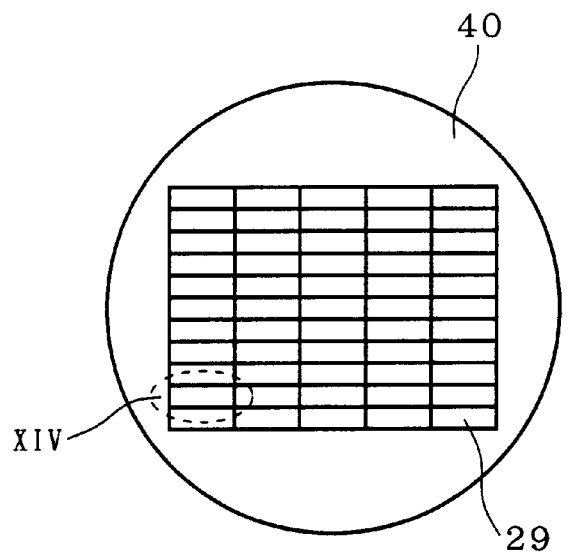
FIG. 13 is a schematic plan view of a sample wafer.
Figure 14:
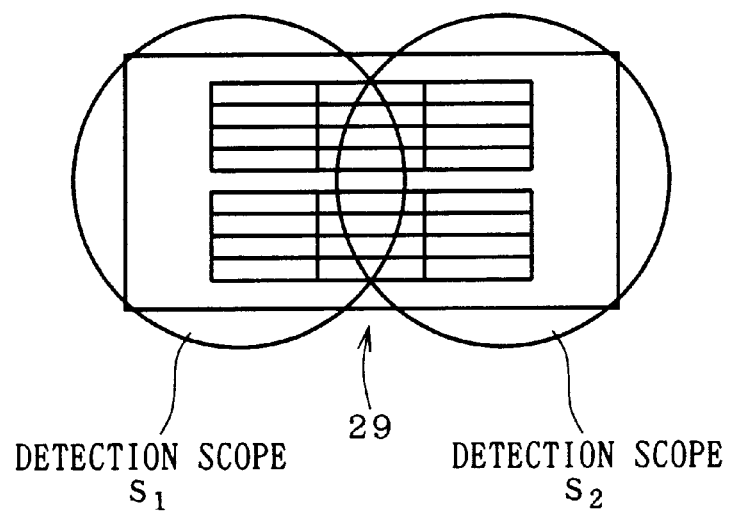
FIG. 14 is a plan view in enlarged scale of a single basic pattern.

FIG. 13 is a diagrammatic plan view of a sample wafer 40. There is shown a case where a total of fifty-five basic patterns 29 are formed on the surface of the sample wafer 40. FIG. 14 is an enlarged plan view of the XIV portion of FIG. 13, i.e., only one reference pattern 29. Each detection scope $S_1$, $S_2$ represents the scope for which detecting means 8 cannot detect the image at a time.

A fourth preferred embodiment relates to a method of obtaining a reference image when a basic pattern 29 is larger than the detection scope $S_1$, $S_2$, as shown in FIG. 14, and the detecting means 8 cannot detect the image related to the entire scope of the basic pattern 29 at a time.

Firstly, a sample wafer 40 is mounted on a mount 5 such that laser light is irradiated on the detection scope $S_1$, the laser light is irradiated from a laser light source 1. In this state, a spatial filter 7 is shifted step-wisely from the origin to obtain a reference image per step. Next, the sample wafer 40 is shifted along with the mount 5 by a mount driving unit 15 such that laser light is irradiated on the detection scope $S_2$, and the laser light is irradiated from the laser light source 1. Then, the spatial filter 7 is shifted step-wisely from the origin in the same manner as described above, to obtain a reference image per step.

Thus, in the pattern defect inspection method of the fourth preferred embodiment, when the detecting means 8 cannot detect the image related to the entire scope of the basic pattern 29 at a time by shifting the sample wafer 40 together with the mount 5 with the mount driving unit 15, the reference images related to the entire scope of the basic pattern 29 can be obtained.

Fifth Preferred Embodiment

Figure 15:
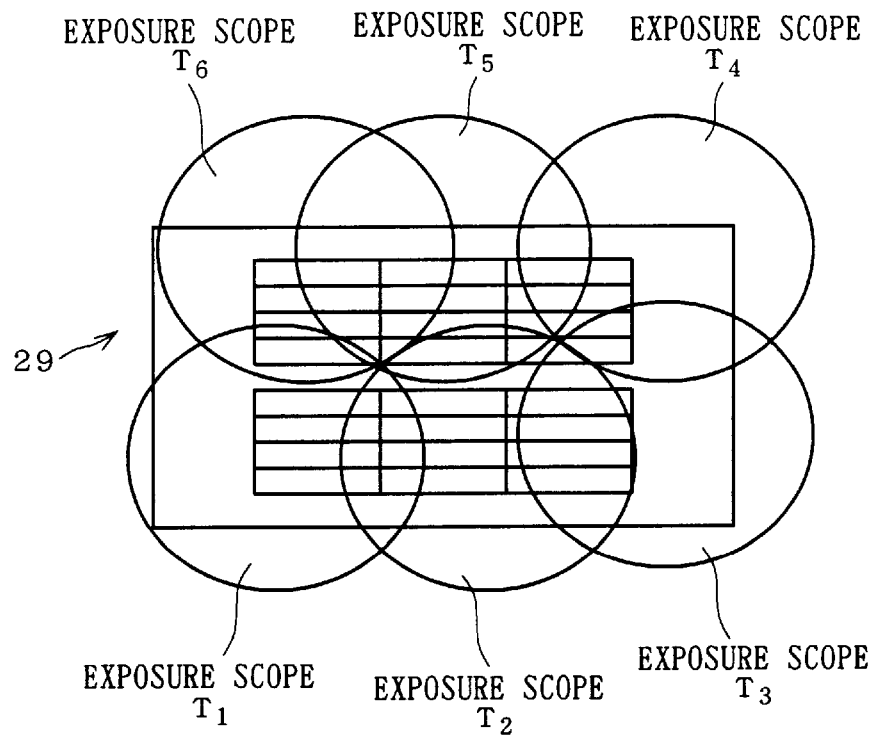
FIG. 15 is a plan view in enlarged scale of another basic pattern.

FIG. 15 is an enlarged plan view of a single basic pattern 29 shown in FIG. 13. In FIG. 15, each of exposure scopes $T_1$ to $T_6$ represents the scope for which a photographic recording plate 19 can be exposed at a time in the formation of a spatial filter 7.

A fifth preferred embodiment relates to a method of forming a spatial filter 7 when a basic pattern 29 is larger than each of the exposure scopes $T_1$ to $T_6$ and a photographic recording plate 19 covering the entire scope of the basic pattern 29 cannot be exposed at a time.

Firstly, a sample wafer 40 is mounted on a mount 5 such that laser light is irradiated on the exposure scope $T_1$. Laser light is irradiated from a laser light source 1 to expose a photographic recording plate 19 disposed at the origin by the reflected diffraction light from the exposure scope $T_1$. Next, the sample wafer 40 is shifted along with the mount 5 by a mount driving unit 15 such that laser light is irradiated on the exposure scope $T_2$. At the same time, the photographic recording plate 19 is shifted from the origin by the same shift amount as that of the sample wafer 40. The shift of the photographic recording plate 19 is performed by a spatial filter driving unit 13. Then, the laser light is irradiated from the laser light source 1 to expose the photographic recording plate 19 by the reflected diffraction light from the exposure scope $T_2$. The same procedure is repeated for the exposure scopes $T_3$ to $T_6$.

Thus, in the pattern defect inspection method of the fifth preferred embodiment, when the photographic recording plate 19 covering the entire scope of the basic pattern 29 cannot be exposed at a time, the sample wafer 40 and the photographic recording plate 19 are shifted in turn to perform the multiple exposure of the photographic recording plate 19. This produces a spatial filter 7 related to the entire scope of the basic pattern 29.

Sixth Preferred Embodiment

Figure 16:
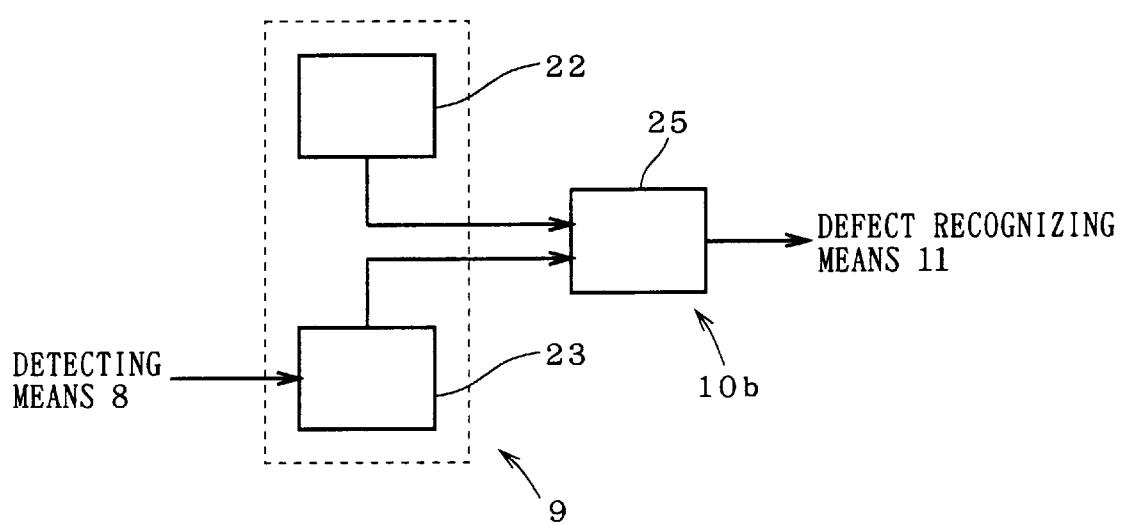
FIG. 16 is a block diagram showing an example of a construction of image storing means and image processing means.

FIG. 16 is a block diagram showing an example of a construction of image storing means 9 and image processing means 10b. All reference images from reference image storing means 22 and a detection image from detection image storing means 23 are inputted to a difference circuit 25. The difference circuit 25 forms an optimum difference image based on the inputted reference images and detection image. The optimum difference image is inputted to defect recognizing means 11.

A method of forming an optimum difference image in the difference circuit 25 is described herebelow. Firstly, each of the reference images from the reference image storing means 22 is compared with the detection image from the detection image storing means 23 to obtain a difference, from which a difference image is formed. The obtained difference images are converted into a brightness histogram, using the brightness to enter the horizontal axis and the number of picture elements to enter the vertical axis. FIGS.

17 and 18 illustrate an example of a brightness histogram prepared in this manner. Thereafter, the first slope downward toward the right in each brightness histogram is represented by a straight line. The amount of the slope of this line is calculated to obtain the absolute value. The difference image providing the brightness histogram with the maximum absolute value is regarded as an optimum difference image.

Figure 17:
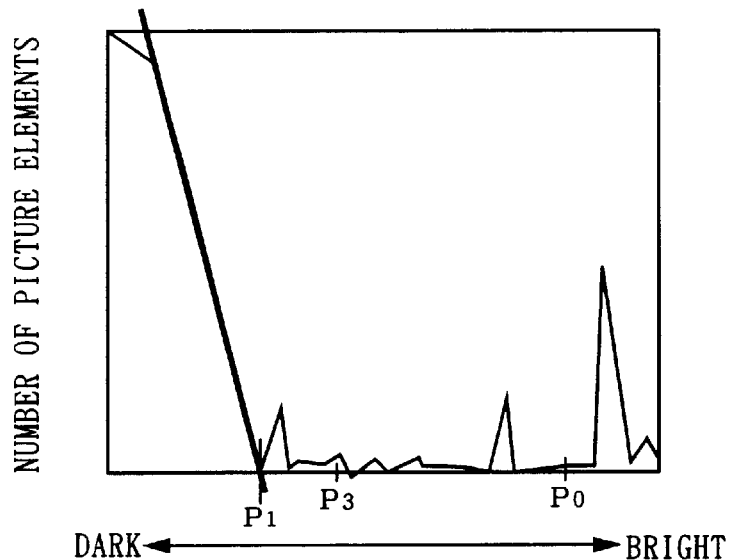
FIG. 17 is a diagram showing a brightness histogram obtained in inspecting a pattern in the central portion of a wafer.
Figure 18:
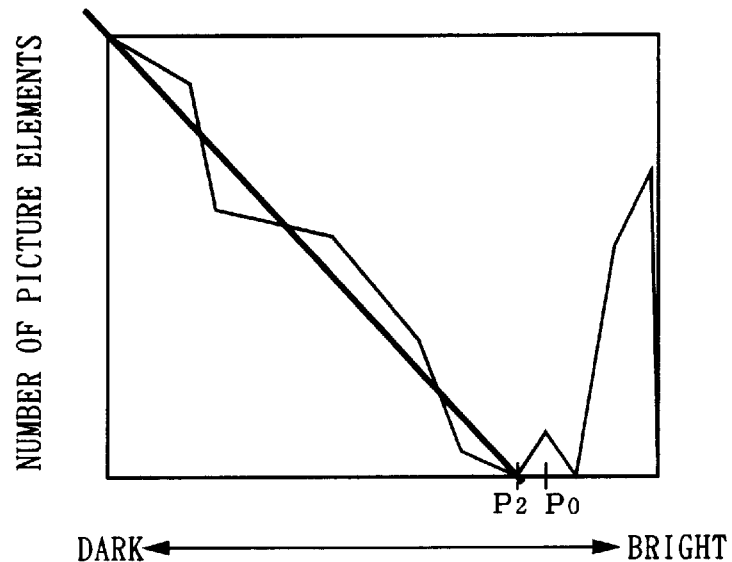
FIG. 18 is a diagram showing a brightness histogram obtained in inspecting a pattern on an edge of a wafer.

Since the central portion of a wafer under test 41 has little wafer warp, the variation of inclination θ is small so that most of the reflected diffraction light from the normal pattern are interrupted by a spatial filter 7. On the other hand, a large wafer warp occurs at the edges of the wafer and the concomitant deviation in angle of reflection is increased. Therefore, a pattern 21 of reflected diffraction light deviates off the interrupting pattern 20 of the spatial filter 7, so that even the reflected diffraction light from the normal pattern often passes through the spatial filter 7. If this is applied to FIGS. 17 and 18, FIG. 17 corresponds to the brightness histogram obtained in inspecting the pattern in the central portion of the wafer, and FIG. 18 corresponds to the brightness histogram obtained in inspecting the pattern at the edge of the wafer. It should be noted that the wafer warp is not limited to the edges of a wafer, but a local warp occurs on the surface of a wafer in some cases. In the following preferred embodiments, the phrase of "the edges of a wafer" means not only the edges of a wafer itself but also portion where wafer warp is ordinarily large, and the phrase of "the central portion of a wafer" includes portion where wafer warp is ordinarily small.

In conventional pattern defect inspections, regardless of whether an inspection region is in the central portion of a wafer under test 41 or the edges of the wafer, portion brighter than a given uniform brightness (threshold value) is recognized as a defect. In this manner, no threshold value can be set in too dark position if considered the inspection for the edges of a wafer. This threshold value is indicated by $P_0$ in FIGS. 17 and 18. Although this threshold value is suited for the edges of a wafer, if $P_0$ is set for the central portion of a wafer, it is impossible to find defects in the brightness ranging from $P_1$ to $P_0$.

Whereas in the pattern defect inspection method according to the sixth preferred embodiment, it is possible to individually set a threshold value based on the brightness histogram obtained in the inspections of the central portion and edge portion of a wafer. Specifically, the threshold value can be set automatically, i.e., the range brighter than $P_2$ (e.g., $P_0$) in inspecting portion with much noise; and the range brighter than $P_1$ (e.g., $P_3$) in inspecting portion with less noise. In this manner, when the central portion of a wafer under test 41 is inspected, it is possible to find defects in the brightness ranging from $P_3$ to $P_0$, which have not been found by the conventional inspections.

Thus, the pattern defect inspection method of the sixth preferred embodiment permits the individual setting of threshold value for portion of much noise and portion of less noise, producing the pattern defect inspection with high accuracy and enlarging the object of inspection.

Seventh Preferred Embodiment

Figure 19:
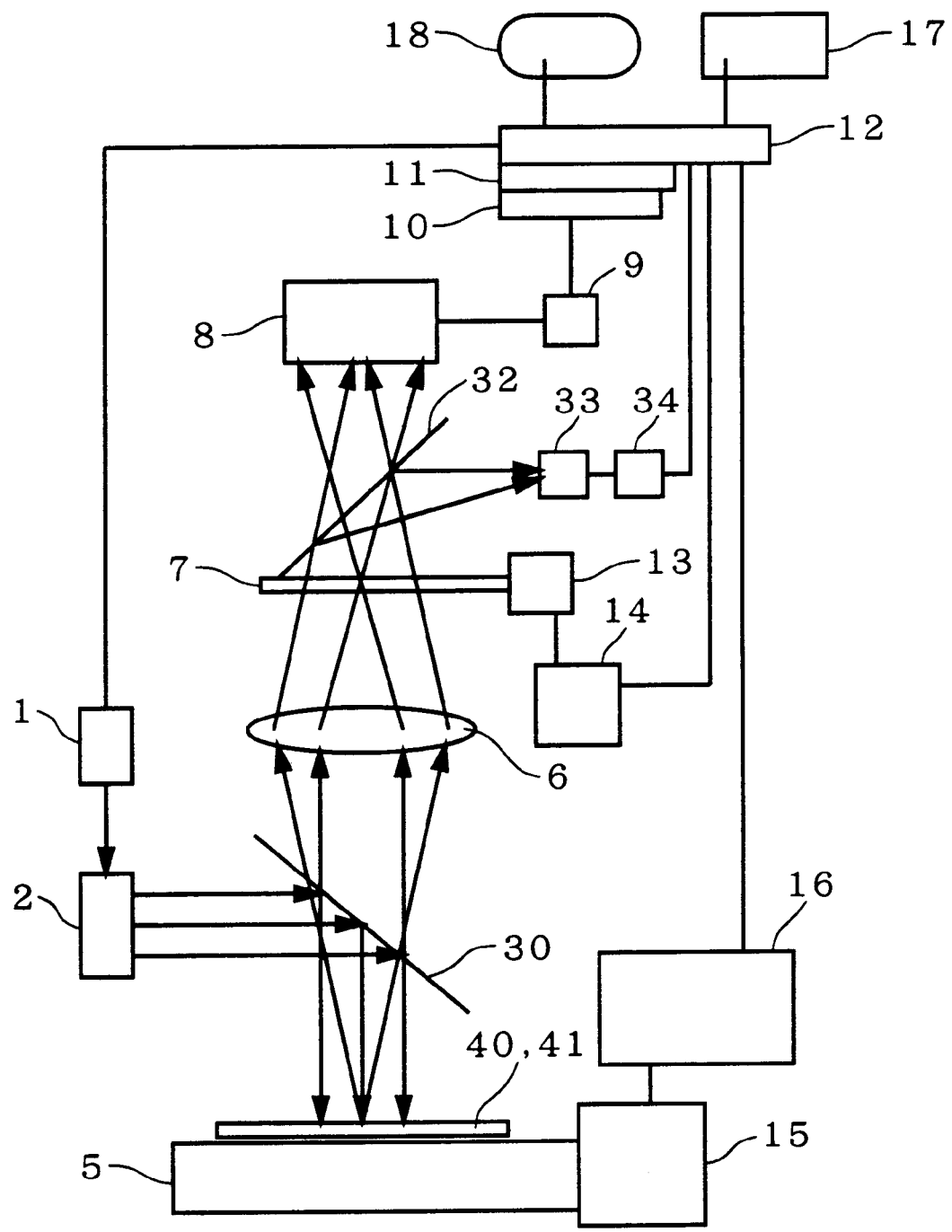
FIG. 19 is a diagram showing a construction of a pattern defect inspection system according to a seventh preferred embodiment of the present invention.

FIG. 19 shows a construction of a pattern defect inspection system according to a seventh preferred embodiment. The reflected diffraction light passing through a spatial filter 7 is taken out by a half mirror 32 at a position between the spatial filter 7 and detecting means 8. The half mirror 32 is arranged such that the image detected by the detecting means 8 becomes identical with the image detected by detecting means 33. The detecting means 33 is connected to signal processing means 34 which is connected to main control means 12.

The reflected diffraction light passed through the spatial filter 7 is detected as an image in the detecting means 8 and is also received by the detecting means 33 through the half mirror 32. The signal processing means 34 calculates the amount of the reflected diffraction light received by the detecting means 33 and, when the obtained amounts exceeds a given arbitrary threshold value, transfers signals therfor to the main control means 12. On receipt of the above signals, the main control means 12 transfers instruction signals of inclination correction and control data to mount control means 16. The mount control means 16 calculates the amount of correction of inclination θ based on the control data, and the correction of inclination θ is performed by an inclination adjusting unit (not shown in FIG. 19) provided on a mount 5. The inclination adjusting means can be any means known in the art.

Thus, in the pattern defect inspection system of the seventh preferred embodiment, the correction of inclination θ is limited to cases where the amount of light of the reflected diffraction light passing through the spatial filter 7 exceeds an arbitrary threshold value. Compared with cases where the correction is made all the time, the number of corrections is lessened to improve the inspection speed.

In addition, reference image storing means 22 having image storing means 9 may store only reference images in the range where the amount of reflected diffraction light passing through the spatial filter 7 does not exceed the above threshold value. This permits a reduction of reference images previously prepared.

Eighth Preferred Embodiment

In the first preferred embodiment a plurality of reference images are obtained by step-wise shift of a spatial filter 7. In this case, the shift amount of the spatial filter 7 from the origin is described in a reference table so as to correspond to each reference image. This reference table is held by main control means 12, for example. After the reference image with the highest correlation is obtained by the correlation circuit 24 shown in FIG. 10 or the decision circuit 28 shows in FIG. 12, mount control means 16 reads from the reference table the shift amount of the spatial filter 7 in obtaining the above reference image. Alternatively, after obtaining an optimum difference image by the difference circuit 25 shown in FIG. 16, the shift amount of the spatial filter 7 in obtaining the reference image providing the optimum difference image is read from the above reference table.

Thereafter, the mount control means 16 converts the shift amount of the spatial filter 7 read from the reference table into the amount of correction of inclination θ and transfers it to a mount driving unit 15. Based on the above correction amount, an inclination adjusting unit on the mount 5 corrects the inclination θ of a wafer under test 41. After the correction, reinspection is conducted. The eighth preferred embodiment can be combined with the seventh preferred embodiment.

Since in the pattern defect inspection method of the eighth preferred embodiment the correction amount of inclination θ is determined based on the shift amount of the spatial filter 7 that is described on the reference table in obtaining the reference images, there is no need to provide a half mirror 112, an ITV camera 113, and a controller 114, which are required in conventional pattern defect inspection systems. This permits the correction of inclination θ without making the system complicated.

Ninth Preferred Embodiment

In the eighth preferred embodiment the mount control means 16 firstly reads the shift amount of the spatial filter 7 from the reference table, converts this shift amount into the correction amount of inclination θ, and corrects the inclination θ of the wafer under test 41. Instead of this, spatial filter control means 14 may read the shift amount of the spatial filter 7 from the reference table and instruct a spatial filter driving unit 13 to shift the spatial filter 7 by the read shift amount.

It is therefore possible to omit the step of converting the shift amount of the spatial filter 7 into the correction amount of diffraction θ to improve the inspection speed. In addition, a mount 5 does not call for an diffraction adjusting unit to simplify the structure of the mount 5. The ninth preferred embodiment can be combined with the seventh preferred embodiment.

Tenth Preferred Embodiment

Figure 20:
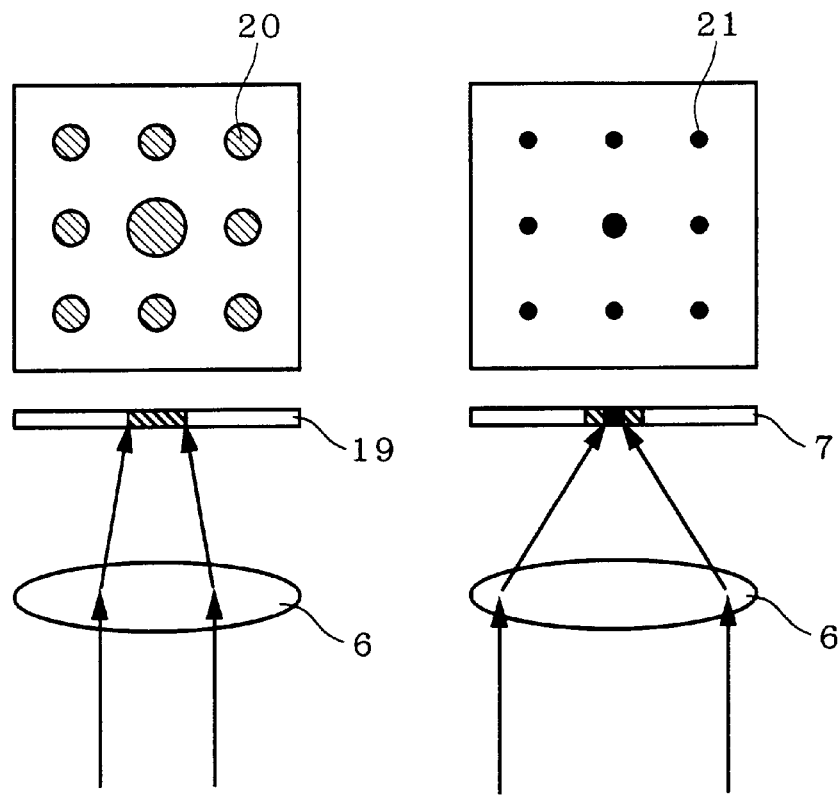
FIG. 20 is a diagram for explaining a pattern defect inspection method according to a tenth preferred embodiment of the present invention.

FIG. 20 is a diagram for explaining a pattern defect inspection method according to a tenth preferred embodiment. Firstly, a photographic recording plate 19 is exposed in the manner as described in the first preferred embodiment, as shown in the left diagram in FIG. 20, to form a spatial filter 7 whose entire surface is provided with an interrupting pattern 20. At the time of inspection, the laser light whose aperture is greater than that of the laser light irradiated in the exposure of the photographic recording plate 19 is irradiated to a wafer under test 41 and its reflected diffraction light is collected by a Fourier transform lens 6, as shown in the right diagram in FIG. 20. The aperture of the laser light to be irradiated to the wafer 41 can be changed by increasing the enlargement magnification of a collimator 2.

In general, between a spot size C at a focal position and an aperture d of incidence laser light there is the relationship expressed by the following equation:

$$C = 2\lambda f/d$$

wherein λ denotes a laser wavelength, and f denotes the focal length of a lens.

As can be seen from the above equation, the spot size C at a focal position is inversely proportional to the aperture d of incidence laser light.

Specifically, the aperture of the laser light irradiated in the formation of a spatial filter 7 is small, and therefore, the reflected diffraction light from a sample wafer 40 is collected in the central portion of a Fourier transform lens 6 to increase the spot size at a focal position. On the other hand, the aperture of the laser light irradiated in the inspection is large, and therefore, the reflected diffraction light from a wafer under test 41 is collected in the peripheral portion of the Fourier transform lens 6 to increase the convergent angle, resulting in a small spot size at a focal position. Therefore, as shown in FIG. 20, the diameter of a pattern 21 of the reflected diffraction light from a normal pattern is smaller than that of an interrupting pattern 20.

Figure 21:
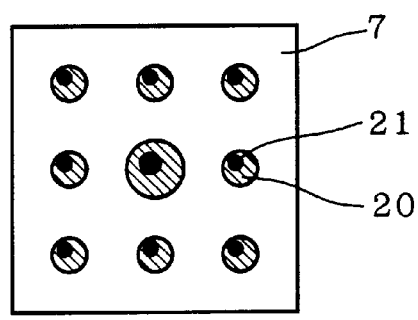
FIG. 21 is a diagram showing a state where a deviation occurs in a pattern of reflected diffraction light due to the variation of inclination $\theta$ of a wafer under test.

FIG. 21 is a diagram showing a state where a pattern 21 of reflected diffraction light has a deviation due to the variation of diffraction θ of a wafer under test 41. As shown in FIG. 21, since the diameter of an interrupting pattern 20 is larger than that of the pattern 21 of reflected diffraction light, if the amount of deviation of the pattern 21 of reflected diffraction light due to the variation of diffraction θ and the like is small, the reflected diffraction light from a normal pattern does not pass through a spatial filter 7.

Thus, the pattern defect inspection method of the tenth preferred embodiment enables to widen the scope of filtering of the spatial filter 7 and to provide a permitted limit for which no correction is made in the pattern defect inspection of the type in which reinspection is conducted after the correction of diffraction θ.

In addition, the reference image storing means 22 in the image storing means 9 need not store reference images in the range where the reflected diffraction light from a normal pattern does not pass through a spatial filter 7, to reduce the number of reference images previously prepared.

Eleventh Preferred Embodiment

In the tenth preferred embodiment the aperture of the laser light irradiated to a wafer under test 41 at the time of inspection is greater than that of the aperture of the laser light irradiated to a sample wafer 40 in order to expose a photographic recording plate 19. In this case, the diameter of a pattern 21 of reflected diffraction light can be set arbitrarily by adjusting the aperture of the laser light irradiated to the wafer 41 with a collimator 2. For instance, when the aperture of the laser light is increased, the diameter of the pattern 21 of reflected diffraction light is decreased as described in the tenth preferred embodiment. This increases the value $\theta_0$ of the inclination θ at which the reflected diffraction light from the normal pattern begins to pass through the spatial filter 7. This means that even if the inclination θ changes in the range of $0 < \theta < \theta_0$, the reflected diffraction light from the normal pattern does not pass through the spatial filter 7.

When it is $\theta > \theta_0$ due to the significant change of inclination θ, the reflected diffraction light from the normal pattern begins to pass through the spatial filter 7 and it is detected by detecting means 8. At that time, the correction of inclination θ is performed in the manner as described in the eighth preferred embodiment, or the correction of position of the spatial filter 7 is performed in the manner as described in the ninth preferred embodiment. Although it is possible to correct such that the inclination θ is 0, the correction may be made to the extent that the inclination θ is smaller than $\theta_0$.

Thus, in the pattern defect inspection system of the eleventh preferred embodiment, it is possible to adjust the amount of reflected diffraction light from the normal pattern that passes through the spatial filter 7 by adjusting the aperture of the laser light irradiated at the inspection with the collimator 2, and also possible to arbitrarily set a permitted limit for which no correction is made. The correction of inclination θ or the correction of the position of the spatial filter 7 is performed when the reflected diffraction light from the normal pattern begins to pass through the spatial filter 7, i.e., when the inclination θ changes significantly. Therefore, compared with the cases where the correction is made all the time, the number of corrections is lessened to improve the speed of pattern defect inspection. Moreover, the correction to the extent that the inclination θ is smaller than $\theta_0$ facilitates to reduce the correction amount to further improve the inspection speed.

In addition, since the reference image storing means 22 in the image storing means 9 need not store reference images in the range where the reflected diffraction light from the normal pattern doe not pass through a spatial filter 7, it is possible to reduce the number of reference images previously prepared.

In the above preferred embodiments, discussed is a case where the collimator 2 is used in order to change the laser light irradiated from the laser light source 1 into a parallel light or control the diameter of the laser light. If the laser light irradiated from the laser light source 1 is regarded as a parallel light, however, the laser light may be directly irradiated to the wafer under test 41, without the collimator 2. Specifically, if the angle of divergence is not more than about ten milliradians, ideally with a Gaussian beam having an angle of infinitesimal divergence of several milliradian order or less, the range within about ±25% in the radius direction around the beam center can be regarded as a parallel light.

Strictly discussing, when the minimum unit (chip size or die size) of repetition of the device pattern to be tested is almost equal to or less than the diameter of the laser light and it is not necessary to enlarge or control the diameter of the laser light, no collimator 2 is needed. For example, a commercial argon ion laser light source has an angle of divergence of three to several tens milliradians, and a laser light irradiated from the light source has a diameter of one to several tens mm. Therefore, if the laser light is used as it is, no collimator 2 is needed. Further, many of high-frequency FETs serving as GaAs transistors and like elements have a chip size of not more than one mm, and when these elements are used, no collimator 2 is needed.

Figure 22:
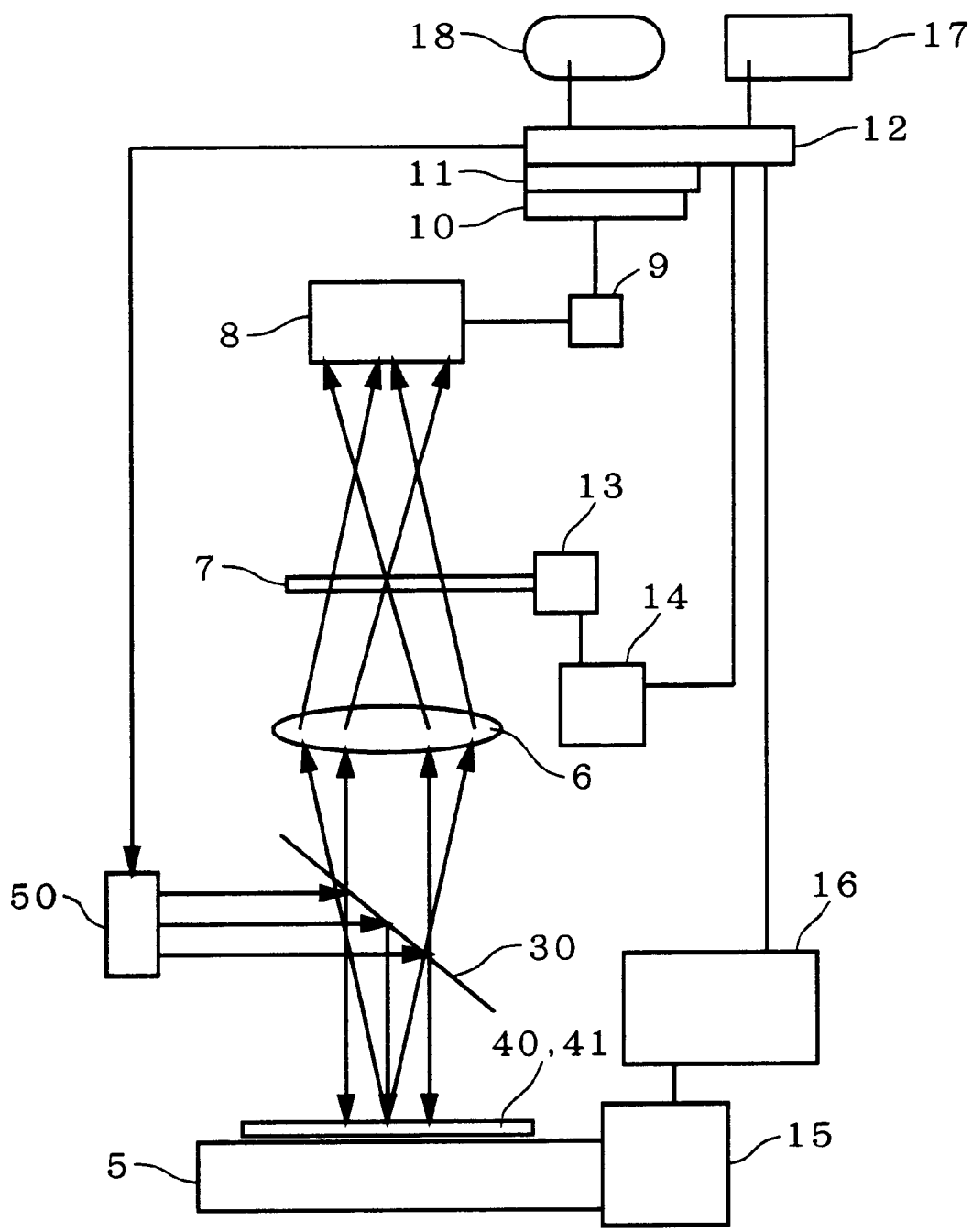
FIG. 22 is a diagram showing a construction of a pattern defect inspection system using a laser light source 50.

FIG. 22 shows a construction of a pattern defect inspection system using a laser light source 50. Operation of the laser light source 50 is controlled by control signals from the main control means 12, and a parallel laser light irradiated from the laser light source 50 is reflected from the half mirror 30 and then irradiated to the sample wafer 40 or the wafer under test 41. In accordance with the pattern defect inspection system having such a construction, since the laser light irradiated from the laser light source 50 is regarded as a parallel light, it is not required to provide a collimator 2 for making a light irradiated from the laser light source 1 parallel light as each of the foregoing preferred embodiments requires. Thus, simplification of the system can be realized.

Twelfth Preferred Embodiment

Figure 23:
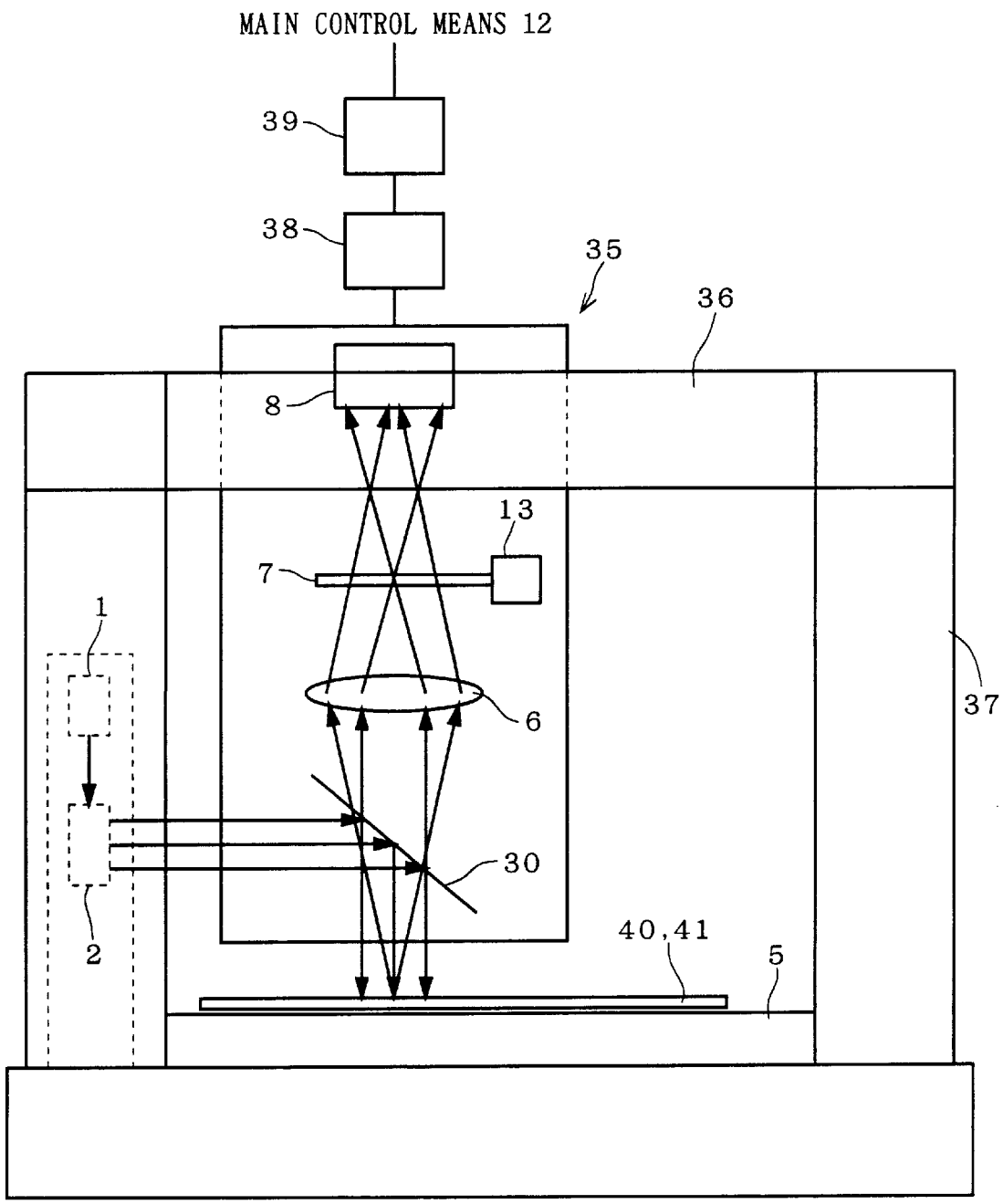
FIG. 23 is a diagram showing a construction of a pattern defect inspection system according to a twelfth preferred embodiment of the present invention.
Figure 24:
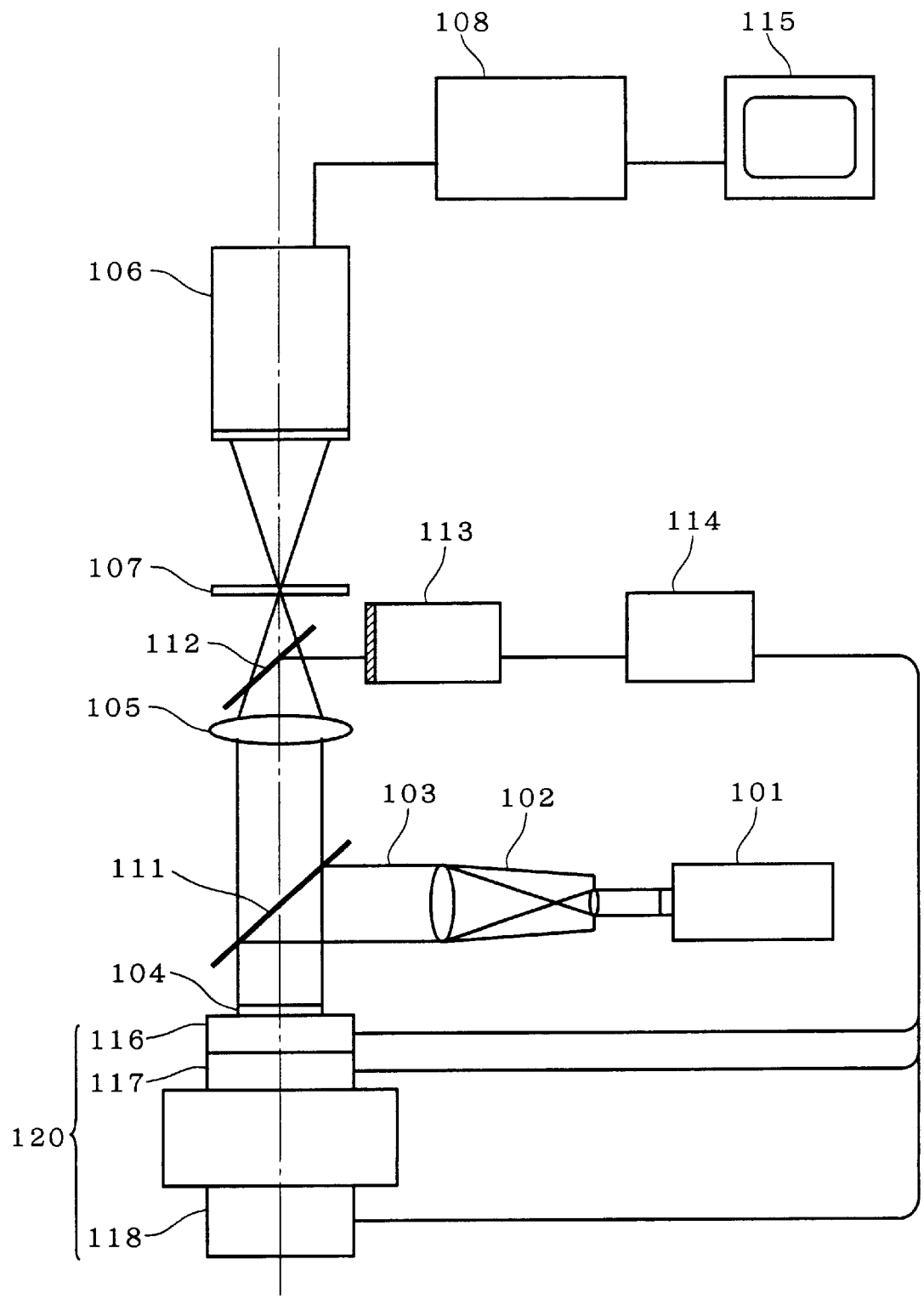
FIG. 24 is a diagram showing a construction of a conventional pattern defect inspection system.

FIG. 23 shows a construction of a pattern defect inspection system according to a twelfth preferred embodiment. An optical system driving unit 38 drives an optical system 35 comprising a half mirror 30, a Fourier transform lens 6, a spatial filter 7, a spatial filter driving unit 13 and detecting means 8, in the vertical direction to an optical axis. Optical system control means 39 controls the optical system driving unit 38. Control systems from main control means 12 are inputted to the optical system control means 39. An optical system holding lateral beam 36 and an optical system holding vertical beam 37 hold the optical system 35. For simplification, image string means 9, image processing means 10, defection recognizing means 11, main control means 12 and spatial filter control means 14 are omitted in FIG. 23.

In each pattern defect inspection system of the foregoing preferred embodiments, in order to inspect the entire wafer under test 41, it is necessary to remove the wafer 41 along with a mount 5 by using a mount driving unit 15. But if a wafer under test 41 has a large area, e.g., TFT wafers, an optical system 35 is small than such a wafer 41, so that the deviation caused by the shift of the optical system 35 is smaller than the deviation caused by the shift of the wafer 41.

On the other hand, in a pattern defect inspection system of the twelfth preferred embodiment, the inspection for the entire wafer is performed by shifting an optical system 35 with an optical system driving unit 38. Therefore, in the inspection of large-area wafers, it is possible to further suppress a decrease of inspection accuracy compared to cases where a wafer is shifted.

While the invention has been shown and described in detail, the foregoing description is in all aspects illustrative and not restrictive. It is therefore understood that numerous other modifications and variations can be devised without departing from the scope of the invention.

I claim:

1. A pattern defect inspection system for detecting a defect of a pattern disposed regularly on a surface of an object under test, said system comprising:

light irradiation means for irradiating first parallel light to said object;

a lens for collecting a reflected diffraction light from said object;

a filter for interrupting a reflected diffraction light from a normal pattern of said object, disposed at a rear focal position of said lens;

first detecting means for receiving said reflected diffraction light passed through said filter to obtain a detection image;

storing means for storing a plurality of reference images;

image processing means for obtaining a difference image from a difference between said detection image and said reference images; and defect recognizing unit for recognizing said defect based on an optimum difference image obtained from said detection image and one selected from said reference images as being most similar to said detection image; characterized in that:

said reference images are obtained by shifting said filter step-wisely from an original position in a plane vertical to an optical axis, receiving a reflected diffraction light from a sample free from said defect by said first detecting means and detecting as an image.

2. The pattern defect inspection system of claim 1 wherein said first parallel light is irradiated from an oblique direction to said object.

3. The pattern defect inspection system of claim 1 wherein said image processing means has a plurality of correlation circuits for examining a correlation between said reference images and said detection image.

4. The pattern defect inspection system of claim 1 further including an inclination adjusting unit for correcting an inclination of said object, characterized in that:

an amount corrected by said inclination adjusting unit is obtained by converting a shift amount of said filter in obtaining said reference images providing said optimum difference image, into an inclination.

5. The pattern defect inspection system of claim 4 characterized in that:

said filter is obtained by irradiating second parallel light to said sample and exposing a photographic dry plate disposed at said rear focal position with a reflected diffraction light from said sample; and an aperture of said first parallel light is larger than an aperture of said second parallel light.

6. The pattern defect inspection system of claim 4 further including second detecting means for detecting an amount of light of said reflected diffraction light at said first detecting means, characterized in that:

a correction with said inclination adjusting unit is executed when said amount of light exceeds a preset threshold value.

7. The pattern defect inspection system of claim 1 further including a filter driving unit for correcting a position of said filter in said plane, characterized in that:

an amount corrected by said filter driving unit is obtained as a shift amount of said filter in obtaining said reference images used for providing said optimum difference image.

8. The pattern defect inspection system of claim 7 characterized in that:

said filter is obtained by irradiating second parallel light to said sample and exposing a photographic dry plate disposed at said rear focal position with a reflected diffraction light from said sample; and an aperture of said first parallel light is larger than an aperture of said second parallel light.

9. The pattern defect inspection system of claim 7 further including second detecting means for detecting an amount of light of said reflected diffraction light at said first detecting means, characterized in that:

a correction with said filter driving unit is executed when said amount of light exceeds a preset threshold value.

10. A pattern defect inspection system for detecting a defect of a pattern disposed regularly on a surface of an object under test, said system comprising:

light irradiation means for irradiating first parallel light to said object;

a lens for collecting a reflected diffraction light from said object;

a filter for interrupting a reflected diffraction light from a normal pattern of said object, disposed at a rear focal position of said lens;

detecting means for receiving said reflected diffraction light passed through said filter to obtain a detection image; and an optical system driving unit for shifting an optical system comprising said lens, said filter, and said detecting means.

11. A pattern defect inspection system for detecting a defect of a pattern disposed regularly on a surface of an object under test, said method comprising the steps of:

irradiating first parallel light to said object;

collecting a reflected diffraction light from said object by a lens;

interrupting a reflected diffraction light from a normal pattern of said object by a filter disposed at a rear focal position of said lens;

receiving said reflected diffraction light passed through said filter to obtain a detection image;

previously preparing a plurality of reference images;

obtaining a difference image from a difference between said detection image and said reference images;

recognizing said defect based on an optimum difference image obtained from said detection image and one selected from said reference images as being most similar to said detection image; characterized in that:

said reference images are obtained by shifting said filter step-wisely from an original position in a plane vertical to an optical axis, receiving a reflected diffraction light from a sample free from said defect, and detecting it as an image.

12. The pattern defect inspection method of claim 11 wherein said reference images are obtained by obtaining a plurality of reference images for a first scope of a basic pattern of said sample, shifting said sample, and obtaining a plurality of reference images for a second scope.

13. The pattern defect inspection method of claim 11 wherein said filter is formed by exposing a photographic dry plate disposed at said rear focal position with said reflected diffraction light from a first scope of a basic pattern of said sample, shifting said sample and said photographic dry plate, and exposing said photographic dry plate with said reflected diffraction light from a second scope.

14. The pattern defect inspection method of claim 11 characterized in that:

said optimum difference image is obtained by converting said difference images into two-axis brightness histograms whose one axis is brightness and another axis is the number of picture elements, and representing a first slope downward toward the right in each of said brightness histograms by straight line, said optimum difference image being a difference image providing said brightness histogram in which an absolute value of an inclination amount of said straight line is a maximum value; and a picture element brighter than a threshold value set in a scope brighter than an intersection of said straight line and said one axis is recognized as a defect.

15. The pattern defect inspection method of claim 11 further including the step of correcting an inclination of said object, characterized in that:

an amount of correction of said inclination is obtained by converting a shift amount of said filter in obtaining said reference images providing said optimum difference image, into an inclination.

16. The pattern defect inspection method of claim 15 characterized in that:

said filter is obtained by irradiating second parallel light to said sample and exposing a photographic dry plate disposed at said rear focal position with a reflected diffraction light from said sample; and an aperture of said first parallel light is larger than an aperture of said second parallel light.

17. The pattern defect inspection method of claim 15 further including the step of detecting an amount of light of said reflected diffraction light passed through said filter, characterized in that:

a correction of said inclination is executed when said amount of light exceeds a preset threshold value.

18. The pattern defect inspection method of claim 11 further including the step of correcting a position of said filter in said plane, characterized in that:

an amount of correction of said position is obtained as a shift amount of said filter in obtaining said reference images providing said optimum difference image.

19. The pattern defect inspection method of claim 18 characterized in that:

said filter is obtained by irradiating second parallel light to said sample and exposing a photographic dry plate disposed at said rear focal position with a reflected diffraction light from said sample; and an aperture of said first parallel light is larger than an aperture of said second parallel light.

20. The pattern defect inspection method of claim 18 further including the step of detecting an amount of light of said reflected diffraction light passed through said filter, characterized in that:

a correction of said filter is executed when said amount of light exceeds a preset threshold value.

* * * * *